(12) United States Patent
Bae et al.

(10) Patent No.: US 12,310,081 B2
(45) Date of Patent: *May 20, 2025

(54) SEMICONDUCTOR DEVICE

(71) Applicant: Samsung Electronics Co., Ltd., Suwon-si (KR)

(72) Inventors: Deok Han Bae, Suwon-si (KR); Ju Hun Park, Seoul (KR); Myung Yoon Um, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/657,993

(22) Filed: May 8, 2024

(65) Prior Publication Data

US 2024/0290855 A1 Aug. 29, 2024

Related U.S. Application Data

(63) Continuation of application No. 17/539,772, filed on Dec. 1, 2021, now Pat. No. 12,009,397.

(30) Foreign Application Priority Data

Apr. 2, 2021 (KR) .................. 10-2021-0043279
Jun. 2, 2021 (KR) .................. 10-2021-0071227

(51) Int. Cl.
| | | |
|---|---|---|
| *H01L 29/417* | (2006.01) | |
| *H01L 27/092* | (2006.01) | |
| *H01L 29/06* | (2006.01) | |
| *H01L 29/423* | (2006.01) | |
| *H01L 29/78* | (2006.01) | |
| *H01L 29/786* | (2006.01) | |

(Continued)

(52) U.S. Cl.
CPC ....... *H10D 64/258* (2025.01); *H10D 30/6219* (2025.01); *H10D 30/6729* (2025.01); *H10D 30/6735* (2025.01); *H10D 62/118* (2025.01); *H10D 84/853* (2025.01); *H10D 30/6211* (2025.01); *H10D 30/67* (2025.01)

(58) Field of Classification Search
CPC ....... H01L 21/02603; H01L 21/823431; H01L 21/823821; H01L 21/845; H01L 27/0886; H01L 27/0924; H01L 27/1211; H01L 29/0665; H01L 29/0669; H01L 29/0673; H01L 29/41733; H01L 29/41755; H01L 29/41791; H01L 29/42392; H01L 29/66439; H01L 29/66795; H01L 29/775; H01L 29/785; H01L 29/7851; H01L 29/7853; H01L 29/7855; H01L 29/786; H01L 2029/7858

See application file for complete search history.

(56) References Cited

U.S. PATENT DOCUMENTS 8,703,595 B2 4/2014 Chuang et al.
9,985,023 B1 5/2018 Liu et al.

(Continued)

*Primary Examiner* — David C Spalla
(74) *Attorney, Agent, or Firm* — Harness, Dickey & Pierce, P.L.C.

(57) ABSTRACT

A semiconductor device including a field insulating layer, which surrounds at least a part of side walls of each of first and second active patterns on a substrate, the field insulating layer including a protrusion protruding upwardly in a vertical direction between the first active pattern and second active pattern, respectively.

20 Claims, 27 Drawing Sheets

(51) Int. Cl.
  *H10D 30/62*  (2025.01)
  *H10D 30/67*  (2025.01)
  *H10D 62/10*  (2025.01)
  *H10D 64/23*  (2025.01)
  *H10D 84/85*  (2025.01)

(56) References Cited

U.S. PATENT DOCUMENTS

| | | |
|---|---|---|
| 10,153,280 B2 | 12/2018 | Chiang et al. |
| 11,532,479 B2 * | 12/2022 | Chen .................. H01L 27/0924 |
| 11,728,223 B2 * | 8/2023 | Chen ................ H01L 23/53295 |
| | | 257/369 |
| 2019/0057907 A1 | 2/2019 | Jun et al. |
| 2019/0206867 A1 * | 7/2019 | Lee ................ H01L 21/823864 |
| 2020/0075421 A1 * | 3/2020 | Wu .................... H01L 21/76877 |
| 2020/0098644 A1 | 3/2020 | Chu et al. |
| 2020/0279848 A1 | 9/2020 | Wang |
| 2021/0013322 A1 | 1/2021 | Xie et al. |
| 2021/0391464 A1 * | 12/2021 | Bae .................... H01L 29/0673 |

* cited by examiner

US 12,310,081 B2

SEMICONDUCTOR DEVICE

CROSS-REFERENCE TO RELATED APPLICATIONS

This application is a continuation of U.S. application Ser. No. 17/539,772, filed on Dec. 1, 2021, which claims priority under 35 U.S.C. § 119 to Korean Patent Application No. 10-2021-0043279 filed on Apr. 2, 2021 and Korean Patent Application No. 10-2021-0071227 filed on Jun. 2, 2021 in the Korean Intellectual Property Office, the contents of each of which in its entirety are herein incorporated by reference.

BACKGROUND

1. Technical Field

The present disclosure relates to semiconductor devices.

2. Description of the Related Art

With the rapid supply of information media in recent years, functions of semiconductor devices have also been dramatically developed. In the case of the recent semiconductor products, a low cost is required for securing competitiveness, and a high integration of products is required for high quality. The semiconductor devices are being scaled down for the high integration.

On the other hand, as a pitch size decreases, there is a need for a research for compensating a decrease in capacitance and ensuring electrical stability between contacts inside the semiconductor device.

SUMMARY

The present disclosure provide semiconductor devices in which difficulty of a process for forming a source/drain contact is reduced, by forming a part of a field insulating layer on an element isolation region between a NMOS region and a PMOS region to protrude in a vertical direction to reduce a depth of a recess for forming the source/drain contact on the element isolation region.

According to an example embodiment of the present disclosure, a semiconductor device may include a substrate including a first region and a second region, the second region being adjacent to the first region in a first horizontal direction, a first active pattern extending in a second horizontal direction on the first region, the second horizontal direction being different from the first horizontal direction, a second active pattern extending in the second horizontal direction on the second region, the second active pattern being spaced apart from the first active pattern in the first horizontal direction, a field insulating layer surrounding at least a part of side walls of each of the first and second active patterns on the substrate, the field insulating layer including a protrusion protruding upwardly in a vertical direction on a boundary line between the first region and the second region, a gate electrode extending in the first horizontal direction on the first and second active patterns, a first source/drain region on at least one side of the gate electrode on the first active pattern, a second source/drain region on at least one side of the gate electrode on the second active pattern, and a source/drain contact electrically connecting the first source/drain region and second source/drain region with each other, the source/drain contact including a first portion and a second portion, the first portion extending toward the field insulating layer between the first source/drain region and the second source/drain region, the second portion on the first portion. A lower surface of the first portion of the source/drain contact may include a recess which is recessed upwardly in the vertical direction, and at least a part of the protrusion may be inside the recess.

According to an example embodiment of the present disclosure, a semiconductor device may include a substrate, a first active region extending in a first horizontal direction on the substrate, a second active region extending in the first horizontal direction on the substrate, the second active region spaced apart from the first active region in a second horizontal direction, the second horizontal direction being different from the first horizontal direction, an element isolation region between the first active region and the second active region, a field insulating layer being on the element isolation region and surrounding at least a part of side walls of the first and second active regions, the first insulating layer including a protrusion protruding upwardly in a vertical direction, a first source/drain region on the first active region, a second source/drain region on the second active region, a source/drain contact electrically connecting the first source/drain region and the second source/drain region with each other, the source/drain contact including a first portion and a second portion, the first portion extending toward the field insulating layer on the element isolation region, a second portion on the first portion, an interlayer insulating layer surrounding the first source/drain region and the source/drain contact on the field insulating layer, and an etching stop layer being between the field insulating layer and the interlayer insulating layer and being between the first source/drain region and the interlayer insulating layer. At least a part of the protrusion may extend into the first portion of the source/drain contact.

According to an example embodiment of the present disclosure, a semiconductor device may include a substrate including an NMOS region and a PMOS region, the PMOS region adjacent to the NMOS region in a first horizontal direction, a first active pattern extending in a second horizontal direction on the NMOS region, the second horizontal direction being different from the first horizontal direction, a second active pattern extending in the second horizontal direction on the PMOS region, the second active pattern being spaced apart from the first active pattern in the first horizontal direction, a field insulating layer surrounding at least a part of side walls of each of the first and second active patterns on the substrate, the field insulating layer including a protrusion protruding upwardly in a vertical direction on a boundary line between the NMOS region and the PMOS region, a gate electrode extending in the first horizontal direction on the first and second active patterns, a first source/drain region on at least one side of the gate electrode on the first active pattern, a second source/drain region on at least one side of the gate electrode on the second active pattern, a source/drain contact electrically connecting the first source/drain region and second source/drain region with each other, the source/drain contact including a first portion and a second portion, the first portion extending toward the field insulating layer between the first source/drain region and the second source/drain region, the second portion on the first portion, an interlayer insulating layer surrounding the first source/drain region and the source/drain contact on the field insulating layer, and an etching stop layer being between the field insulating layer and the interlayer insulating layer and being between the first source/drain region and the interlayer insulating layer. An upper portion of the protrusion may be lower than an upper surface of the first active pattern that is in contact with the first source/drain region, a lower surface of the first portion of the source/drain contact may include a recess that is recessed upwardly in the vertical direction, and at least a part of the protrusion may be in contact with the first portion of the source/drain contact inside the recess.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof referring to the attached drawings, in which.

DETAILED DESCRIPTION

Although the drawings of a semiconductor device according to some example embodiments show a fin-type transistor (FinFET) including a channel region of a fin-type pattern shape including nanosheet, and a MBCFET™ (Multi-Bridge Channel Field Effect Transistor) as examples, the present disclosure is not limited thereto.

Hereinafter, semiconductor devices according to some example embodiments of the present disclosure will be described referring to FIGS. 1 to 4.

Figure 1:
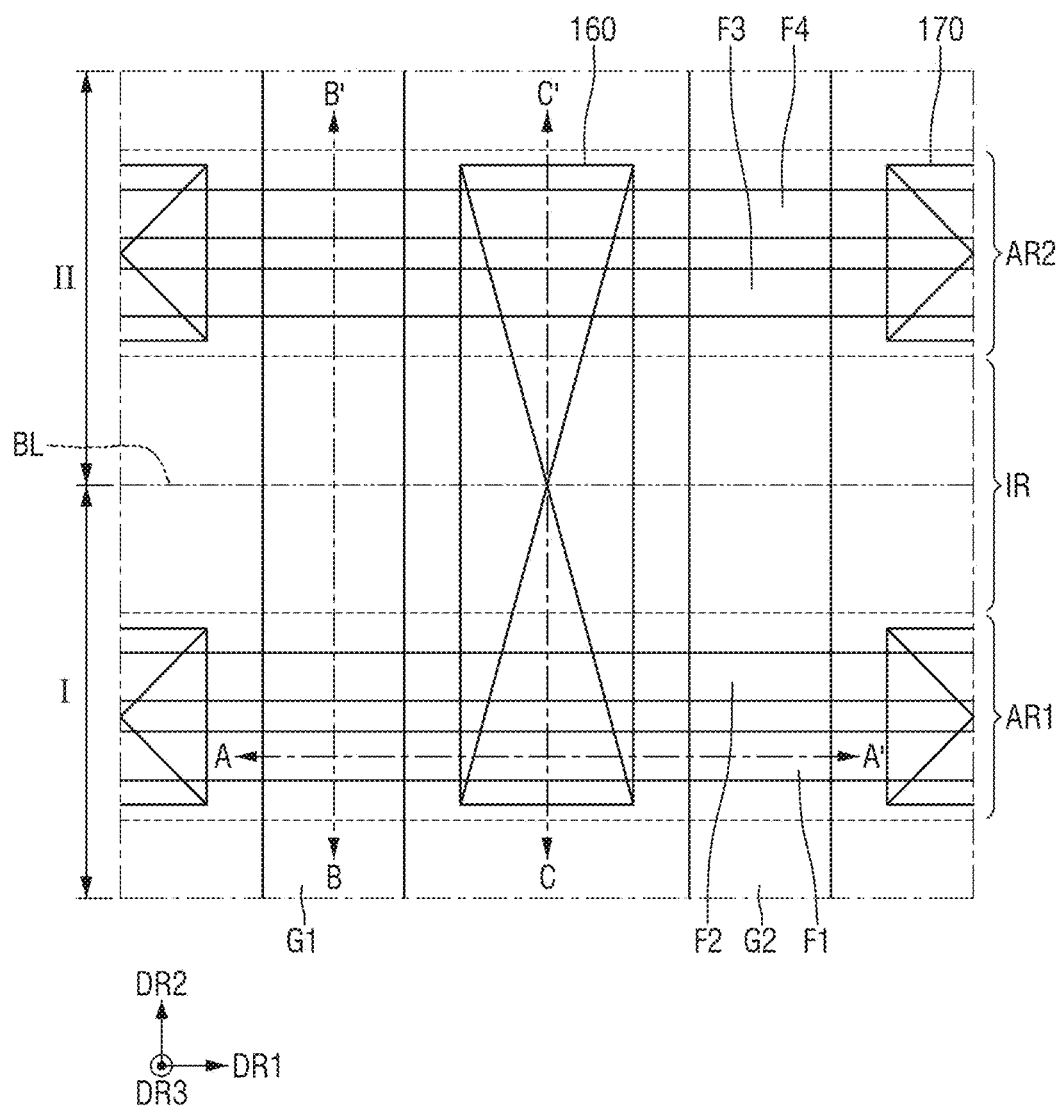
FIG. 1 is a layout diagram for explaining a semiconductor device according to some example embodiments of the present disclosure.
Figure 2:
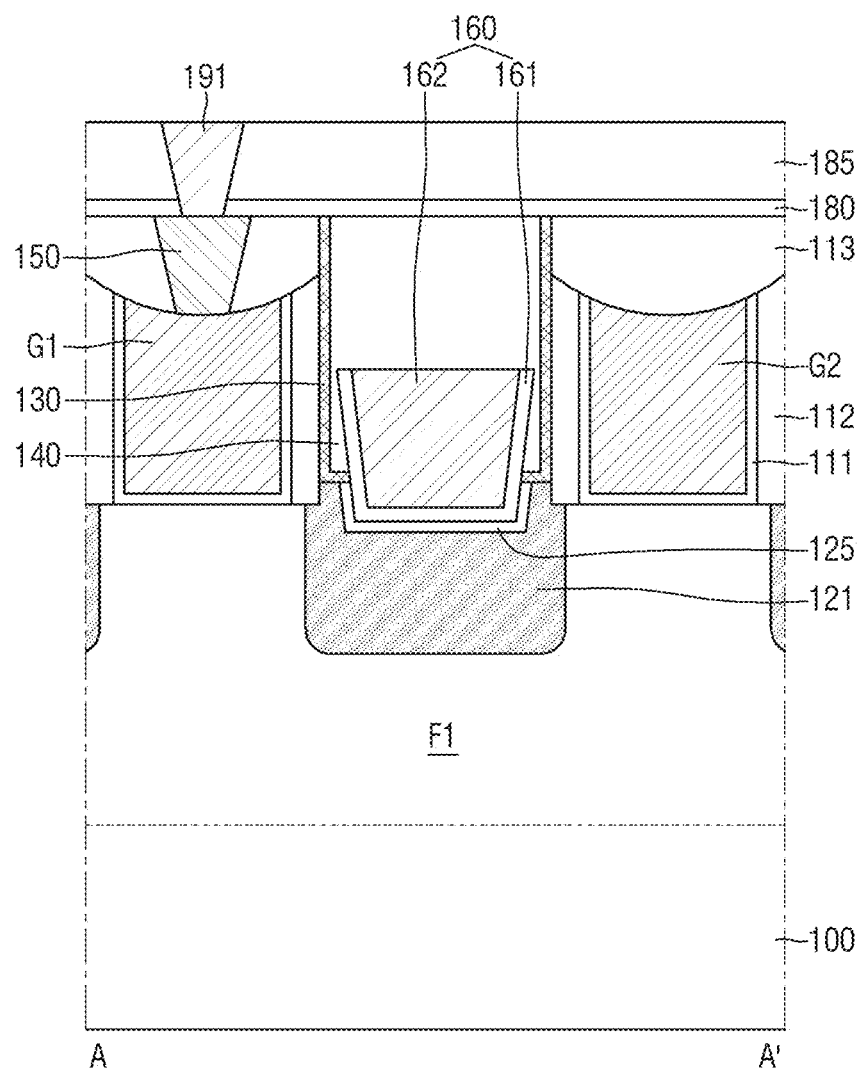
FIG. 2 is a cross-sectional view taken along a line A-A' of FIG. 1.
Figure 3:
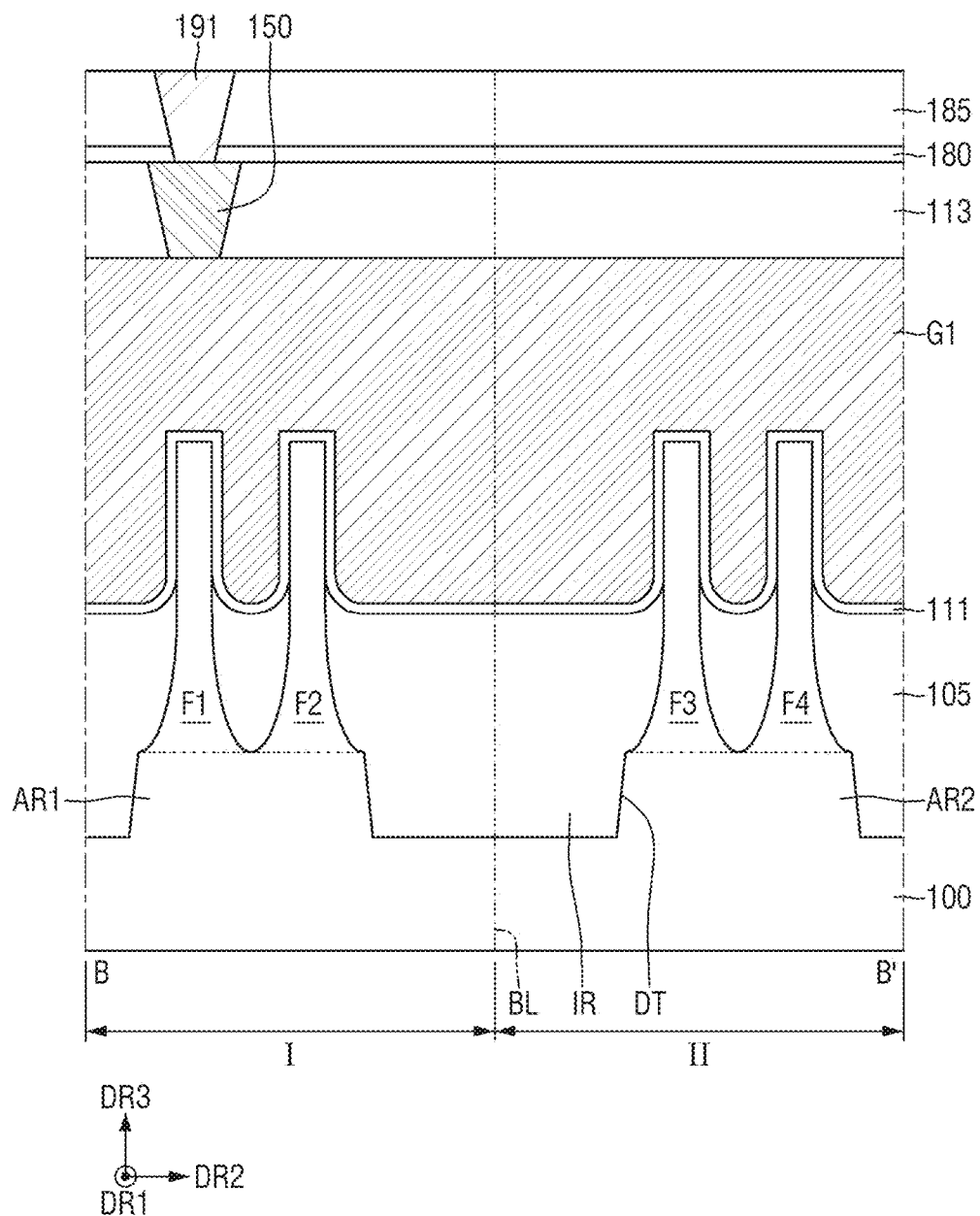
FIG. 3 is a cross-sectional view taken along a line B-B' of FIG. 1.
Figure 4:
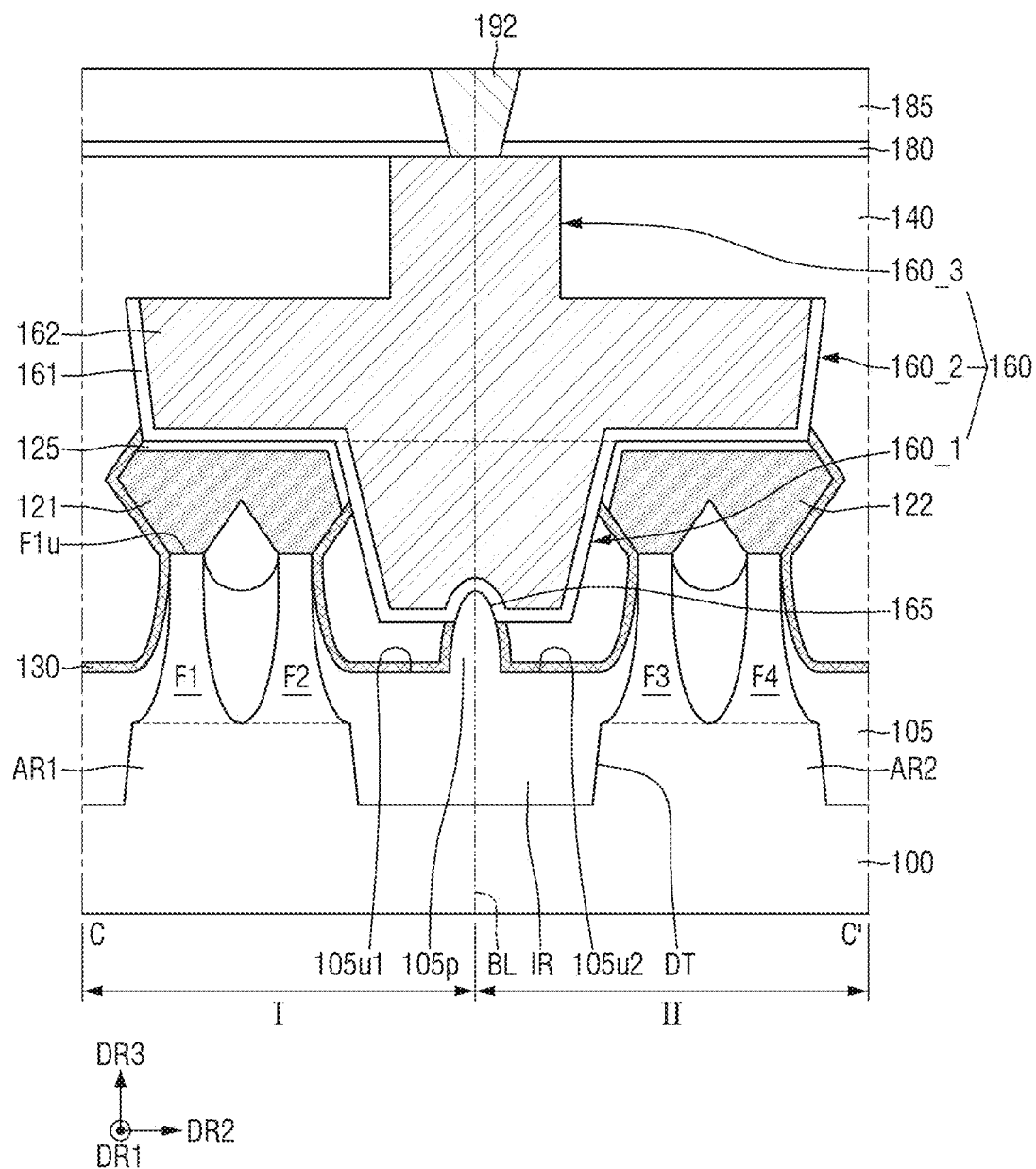
FIG. 4 is a cross-sectional view taken along a line D-D' of FIG. 1.

FIG. 1 is a layout diagram for explaining a semiconductor device according to some example embodiments of the present disclosure. FIG. 2 is a cross-sectional view taken along a line A-A' of FIG. 1. FIG. 3 is a cross-sectional view taken along a line B-B' of FIG. 1. FIG. 4 is a cross-sectional view taken along a line D-D' of FIG. 1.

Referring to FIGS. 1 to 4, the semiconductor device according to some example embodiments of the present disclosure includes a substrate 100, first and second active regions AR1 and AR2, an element isolation region IR, first to fourth active patterns F1, F2, F3 and F4, a field insulating layer 105, first and second gate electrodes G1 and G2, a gate insulating layer 111, a gate spacer 112, a capping pattern 113, a first source/drain region 121, a second source/drain region 122, a silicide layer 125, a first etching stop layer 130, a first interlayer insulating layer 140, a gate contact 150, a first source/drain contact 160, a second source/drain contact 170, a second etching stop layer 180, a second interlayer insulating layer 185, a first via 191 and a second via 192

The substrate 100 may be a silicon substrate or an SOI (silicon-on-insulator). In some example embodiments, the substrate 100 may include silicon germanium, SGOI (silicon germanium on insulator), indium antimonide, lead tellurium compounds, indium arsenic, indium phosphide, gallium arsenide or gallium antimonide. However, the present disclosure is not limited thereto.

The substrate 100 may include a first region I and a second region II. The second region II may be defined as a region that is adjacent to the first region I in a second horizontal direction DR2. For example, the first region I may be an NMOS region, and the second region II may be a PMOS region.

A first active region AR1 may be disposed on the first region I. A second active region AR2 may be disposed on the second region II. Each of the first active region AR1 and the second active region AR2 may protrude upwardly from the substrate 100 in a vertical direction DR3. The first active region AR1 and the second active region AR2 may be defined by a deep trench DT.

The element isolation region IR may be defined as a region in which the deep trench DT is formed. That is, the element isolation region IR may be disposed between the first active region AR1 and the second active region AR2. A boundary line BL between the first region I and the second region II may be formed in the element isolation region IR.

The first active region AR1 may extend in a first horizontal direction DR1 that is different from the second horizontal direction DR2. The second active region AR2 may be spaced apart from the first active region AR1 in the second horizontal direction DR2. The second active region AR2 may extend in the first horizontal direction DR1.

Each of a first active pattern F1 and a second active pattern F2 may extend in the first horizontal direction DR1 on the first active region AR1. Each of the first active pattern F1 and the second active pattern F2 may protrude upwardly from the first active region AR1 in the vertical direction DR3. The second active pattern F2 may be spaced apart from the first active pattern F1 in the second horizontal direction DR2.

Each of a third active pattern F3 and a fourth active pattern F4 may extend in the first horizontal direction DR1 on the second active region AR2. Each of the third active pattern F3 and the fourth active pattern F4 may protrude upwardly from the second active region AR2 in the vertical direction DR3. The fourth active pattern F4 may be spaced apart from the third active pattern F3 in the second horizontal direction DR2.

Each of the first to fourth active patterns F1, F2, F3 and F4 may be a part of the substrate 100, and may include an epitaxial layer that is grown from the substrate 100. Each of the first to fourth active patterns F1, F2, F3 and F4 may include, for example, silicon or germanium, which is an elemental semiconductor material. In some example embodiments, each of the first to fourth active patterns F1, F2, F3 and F4 may include a compound semiconductor, and may include, for example, a group IV-IV compound semiconductor or a group III-V compound semiconductor.

The group IV-IV compound semiconductor may include, for example, a binary compound or a ternary compound containing at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) or indium (In) as a group III element with one of phosphorus (P), arsenic (As) or antimony (Sb) as a group V element.

The field insulating layer 105 may be disposed on the substrate 100. The field insulating layer 105 may fill the inside of the deep trench DT. The field insulating layer 105 may surround the side walls of each of the first active region AR1 and the second active region AR2. The field insulating layer 105 may surround at least a part of side walls of each of the first to fourth active patterns F1, F2, F3 and F4.

The field insulating layer 105 may include a protrusion 105p that protrudes upwardly in the vertical direction DR3 on the boundary line BL between the first region I and the second region II. That is, the protrusion 105p may protrude upwardly in the vertical direction DR3 from a first upper surface 105u1 of the field insulating layer 105 that is disposed in the element isolation region IR between the protrusion 105p and the first active region AR1. Further, the protrusion 105p may protrude upwardly in the vertical direction DR3 from a second upper surface 105u2 of the field insulating layer 105 that is disposed in the element isolation region IR between the protrusion 105p and the second active region AR2.

For example, an upper end of the protrusion 105p may be lower than an upper surface F1u of the first active pattern F1 that is in contact with a first source/drain region 121. For example, each of the first upper surface 105u1 of the field insulating layer 105 and the second upper surface 105u2 of the field insulating layer 105 may be lower than the upper surface of the field insulating layer 105 that is in contact with the gate insulating layer 111. The field insulating layer 105 may include, for example, an oxide film, a nitride film, an oxynitride film or a combination film thereof.

Each of the first gate electrode G1 and the second gate electrode G2 may extend in the second horizontal direction DR2 on the field insulating layer 105 and the first to fourth active patterns F1, F2, F3 and F4. Each of the first gate electrode G1 and the second gate electrode G2 may intersect each of the first to fourth active patterns F1, F2, F3 and F4. The second gate electrode G2 may be spaced apart from the first gate electrode G1 in the first horizontal direction DR1.

Each of the first gate electrode G1 and the second gate electrode G2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. Each of the first gate electrode G1 and the second gate electrode G2 may include a conductive metal oxide, a conductive metal oxynitride, and the like, and may also include an oxidized form of the above-mentioned materials.

The gate spacer 112 may be disposed on the first active region AR1, the second active region AR2 and the field insulating layer 105. The gate spacer 112 may extend in the second horizontal direction DR2 along the side walls of each of the first gate electrode G1 and the second gate electrode G2. The gate spacer 112 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

The gate insulating layer 111 may be disposed between each of the first and second gate electrodes G1 and G2 and the gate spacer 112. The gate insulating layer 111 may be disposed between each of the first and second gate electrodes G1 and G2 and each of the first to fourth active patterns F1, F2, F3 and F4. The gate insulating layer 111 may be disposed between each of the first and second gate electrodes G1 and G2 and the field insulating layer 105.

The gate insulating layer 111 may include at least one of silicon oxide, silicon oxynitride, silicon nitride, or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A semiconductor device according to some other example embodiments may include an NC (Negative Capacitance) FET that uses a negative capacitor. For example, the gate insulating layer 111 may include a ferroelectric material film having ferroelectric properties, and/or a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors that are connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film that are connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide or a metal oxide having a high dielectric constant. The metal oxide included in the paraelectric material film may include, for example, but is not limited to, at least one of hafnium oxide, zirconium oxide, or aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the gate insulating layer 111 may include one ferroelectric material film. As another example, the gate insulating layer 111 may include a plurality of ferroelectric material films spaced apart from each other. The gate insulating layer 111 may have a stacked film structure in which a plurality of ferroelectric material films and a plurality of paraelectric material films are alternately stacked.

The capping pattern 113 may extend in the second horizontal direction DR2 on each of the first gate electrode G1 and the second gate electrode G2. For example, the capping pattern 113 may be in contact with a top surface of the gate insulating layer 111 and an upper surface of the gate spacer 112. However, the present disclosure is not limited thereto. In some other example embodiments, the capping pattern 113 may be disposed between the gate spacers 112. The capping pattern 113 may include, for example, at least one of silicon nitride (SiN), silicon oxynitride (SiON), silicon oxide ($SiO_2$), silicon carbonitride (SiCN), silicon oxycarbonitride (SiOCN), or combinations thereof.

The first source/drain region 121 may be disposed on at least one side of the first gate electrode G1 on the first and second active patterns F1 and F2. Also, the first source/drain region 121 may be disposed on at least one side of the second gate electrode G2 on the first and second active patterns F1 and F2. Although FIG. 2 shows that the upper surface of the first source/drain region 121 is higher the lower surface of the gate spacer 112, the present disclosure is not limited thereto.

The second source/drain region 122 may be disposed on at least one side of the first gate electrode G1 on the third and fourth active patterns F3 and F4. Also, the second source/drain region 122 may be disposed on at least one side of the second gate electrode G2 on the third and fourth active patterns F3 and F4.

The first interlayer insulating layer 140 may cover the gate spacer 112, the field insulating layer 105, the first source/drain region 121 and the second source/drain region 122. For example, the upper surface of the first interlayer insulating layer 140 may be formed on the same plane as the upper surface of the capping pattern 113. However, the present disclosure is not limited thereto. In some other example embodiments, the first interlayer insulating layer 140 may also cover the upper surface of the capping pattern 113.

For example, the first interlayer insulating layer 140 may not be disposed between the field insulating layer 105 and the first source/drain region 121, between the first active pattern F1 and the second active pattern F2. Further, the first interlayer insulating layer 140 may not be disposed between the field insulating layer 105 and the second source/drain region 122, between the third active pattern F3 and the fourth active pattern F4. An air gap may be formed in a portion in which the first interlayer insulating layer 140 is not formed, in the lower portion of each of the first source/drain region 121 and the second source/drain region 122. However, the present disclosure is not limited thereto.

The first interlayer insulating layer 140 may include, for example, at least one of silicon oxide, silicon nitride, silicon oxynitride, or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxy DitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

The first etching stop layer 130 may be disposed along a profile of the upper surface of the field insulating layer 105. For example, the first etching stop layer 130 may be disposed between the field insulating layer 105 and the first interlayer insulating layer 140.

The first etching stop layer 130 may be disposed along the profile of side walls of each of the first source/drain region 121 and the second source/drain region 122. For example, the first etching stop layer 130 may be disposed between the first source/drain region 121 and the first interlayer insulating layer 140. Further, the first etching stop layer 130 may be disposed between the second source/drain region 122 and the first interlayer insulating layer 140. As shown in FIG. 2, the first etching stop layer 130 may be disposed along the side walls of the gate spacer 112 and the side walls of the capping pattern 113. The first etching stop layer 130 may include, for example, at least one of silicon oxide, silicon nitride, silicon oxynitride or a low dielectric constant material.

The gate contact 150 may penetrate the capping pattern 113 in the vertical direction DR3 and be connected to at least one of the first and second gate electrodes G1 and G2. Although FIGS. 2 and 3 show that the gate contact 150 is disposed on the first active region AR1, this is for convenience of explanation, and the present disclosure is not limited thereto. In some other example embodiments, the gate contact 150 may be disposed on the second active region AR2 or the element isolation region IR.

Although FIGS. 2 and 3 show that the gate contact 150 is formed of a single film, this is for convenience of explanation, and the present disclosure is not limited thereto. That is, the gate contact 150 may be formed of multiple films. The gate contact 150 may include a conductive substance.

The first source/drain contact 160 may extend in the second horizontal direction DR2, on the first active region AR1, the element isolation region IR and the second active region AR2. For example, the first source/drain contact 160 may be disposed between the first gate electrode G1 and the second gate electrode G2. The first source/drain contact 160 penetrates the first interlayer insulating layer 140 in the vertical direction DR3 and may be electrically connected to each of the first source/drain region 121 and the second source/drain region 122.

The first source/drain contact 160 may include a first portion 160_1, a second portion 160_2, and a third portion 160_3. The first portion 160_1 of the first source/drain contact 160 may be disposed between the first source/drain region 121 and the second source/drain region 122. The first portion 160_1 of the first source/drain contact 160 may be disposed on the element isolation region IR.

A lower surface of the first portion 160_1 of the first source/drain contact 160 may include a recess 165 that is recessed upwardly in the vertical direction DR3. At least a part of the protrusion 105p may be disposed inside the recess 165. That is, at least a part of the protrusion 105p may extend into the first portion 160_1 of the first source/drain contact 160. The first portion 160_1 of the first source/drain contact 160 may surround at least a part of the protrusion 105p. The lower surface of the first portion 160_1 of the first source/drain contact 160 may be lower than lower surfaces of each of the first source/drain region 121 and the second source/drain region 122.

The first etching stop layer 130 may not be disposed between the protrusion 105p and the recess 165. That is, the first source/drain contact 160 may be in contact with the protrusion 105p inside the recess 165.

The second portion 160_2 of the first source/drain contact 160 may be disposed on the first portion 160_1 of the first source/drain contact 160. The second portion 160_2 of the first source/drain contact 160 may be disposed on the upper surfaces of each of the first source/drain region 121 and the second source/drain region 122.

A width of the second portion 160_2 of the first source/drain contact 160 in the second horizontal direction DR2 may be greater than a width of the first portion 160_1 of the first source/drain contact 160 in the second horizontal direction DR2.

The third portion 160_3 of the first source/drain contact 160 may protrude upwardly in the vertical direction DR3 from the second portion 160_2 of the first source/drain contact 160. A width of the third portion 160_3 of the first source/drain contact 160 in the second horizontal direction DR2 may be narrower than a width of the second portion 160_2 of the first source/drain contact 160 in the second horizontal direction DR2.

The first source/drain contact 160 may include a barrier layer 161 and a filling layer 162. The barrier layer 161 may form side walls and bottom surfaces of the first portion 160_1 and second portion 160_2 of the first source/drain contact 160. The barrier layer 161 may not be disposed on the upper surface of the second portion 160_2 of the first source/drain contact 160 and the side walls of the third portion 160_3 of the first source/drain contact 160. That is, the upper surface of the second portion 160_2 of the first source/drain contact 160 and the side walls of the third portion 160_3 of the first source/drain contact 160 may be in contact with the first interlayer insulating layer 140. However, the present disclosure is not limited thereto.

The barrier layer 161 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh).

The filling layer 162 may be disposed on the barrier layer 161. The filling layer 162 may include, for example, at least one of aluminum (Al), tungsten (W), cobalt (Co), ruthenium (Ru), or molybdenum (Mo).

The second source/drain contact 170 may be disposed on one side of each of the first gate electrode G1 and the second gate electrode G2. For example, the first gate electrode G1 may be disposed between the first source/drain contact 160 and the second source/drain contact 170. Further, the second gate electrode G2 may be disposed between the first source/drain contact 160 and the second source/drain contact 170.

The second source/drain contact 170 may be disposed above each of the first active region AR1 and the second active region AR2. The second source/drain contact 170 disposed on the second active region AR2 may be spaced apart from the second source/drain contact 170 disposed on the first active region AR1 in the horizontal direction DR2. The second source/drain contact 170 penetrates the first interlayer insulating layer 140 in the vertical direction DR3, and may be electrically connected to each of the first source/drain region 121 and the second source/drain region 122.

A silicide layer 125 may be disposed between the first source/drain region 121 and the first source/drain contact 160. Further, the silicide layer 125 may be disposed between the second source/drain region 122 and the first source/drain contact 160. The silicide layer 125 may include, for example, a metal silicide substance.

The second etching stop layer 180 may be disposed on the first interlayer insulating layer 140, the gate contact 150, the first source/drain contact 160, the second source/drain contact 170, and the capping pattern 113. The second etching stop layer 180 may include, for example, at least one of silicon oxide, silicon nitride, silicon oxynitride or a low dielectric constant material.

The second interlayer insulating layer 185 may be disposed on the second etching stop layer 180. The second interlayer insulating layer 185 may include, for example, at least one of silicon oxide, silicon nitride, silicon oxynitride or a low dielectric constant material.

The first via 191 may penetrate the second interlayer insulating layer 185 and the second etching stop layer 180 in the vertical direction DR3 and be connected to the gate contact 150. Although FIGS. 2 and 3 show that the first via 191 is formed of a single film, this is for convenience of explanation, and the present disclosure is not limited thereto. That is, the first via 191 may be formed of multiple films. The first via 191 may include a conductive substance.

For example, the second via 192 penetrates the second interlayer insulating layer 185 and the second etching stop layer 180 in the vertical direction DR3 and may be connected to the third portion 160_3 of the first source/drain contact 160. Although FIG. 4 shows that the second via 192 is formed of a single film, this is for convenience of explanation, and the present disclosure is not limited thereto. That is, the second via 192 may be formed of multiple films. The second via 192 may include a conductive substance.

In the semiconductor device according to some example embodiments of the present disclosure, by forming a part of the field insulating layer 105 to penetrate (e.g., protrude upwardly) in the vertical direction DR3 on the element isolation region IR between the NMOS region I and the NMOS region II, the depth of the recess for forming the source/drain contact 160 on the element isolation region IR may be reduced, thereby reducing difficulty of the process for forming the source/drain contact 160.

Hereinafter, a method for fabricating a semiconductor device according to some example embodiments of the present disclosure will be described referring to FIGS. 5 to 16.

FIGS. 5 to 16 are intermediate stage diagrams for explaining the method for fabricating the semiconductor device according to some example embodiments of the present disclosure.

Figure 5:
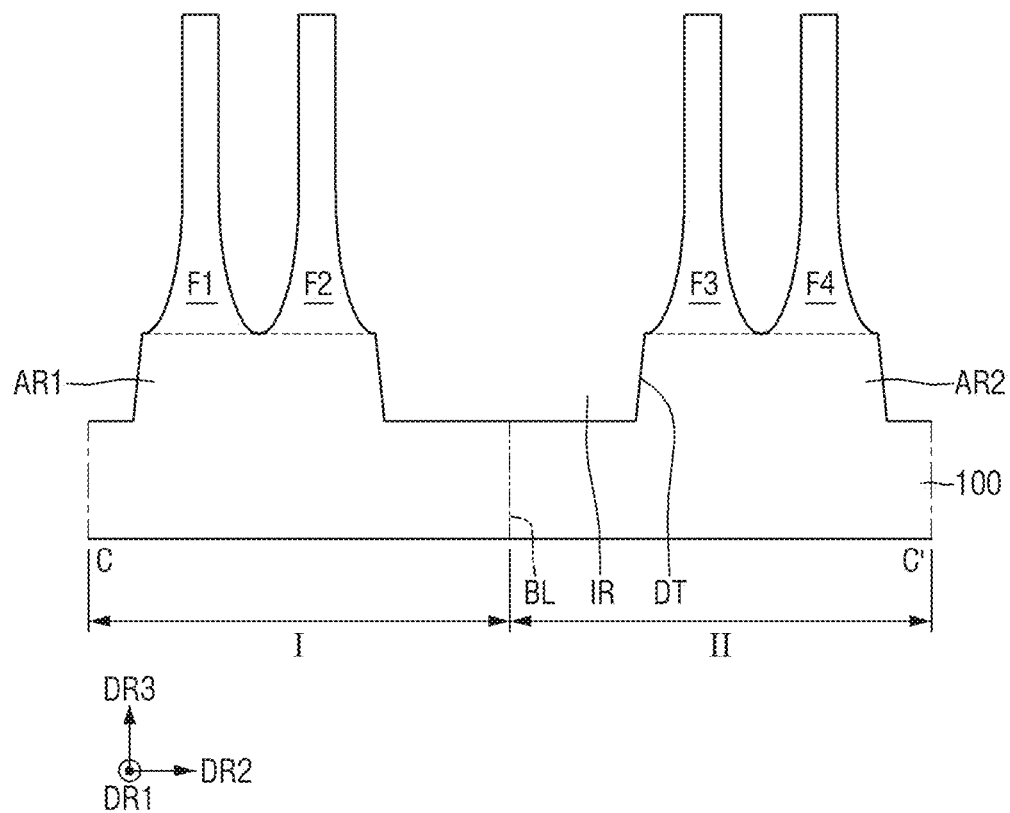
FIGS. 5 to 16 are intermediate stage diagrams for explaining a method for fabricating a semiconductor device according to some example embodiments of the present disclosure.

Referring to FIG. 5, a part of the substrate 100 may be etched to form a deep trench DT. A region in which the deep trench DT is formed may be defined as the element isolation region IR. The first active region AR1 and the second active region AR2 may be defined by the element isolation region IR.

The first active pattern F1 and the second active pattern F2 spaced apart from each other in the second horizontal direction DR2 may be formed on the first active region AR1. Further, the third active pattern F3 and the fourth active pattern F4 spaced apart from each other in the second horizontal direction DR2 may be formed on the second active region AR2.

Figure 6:
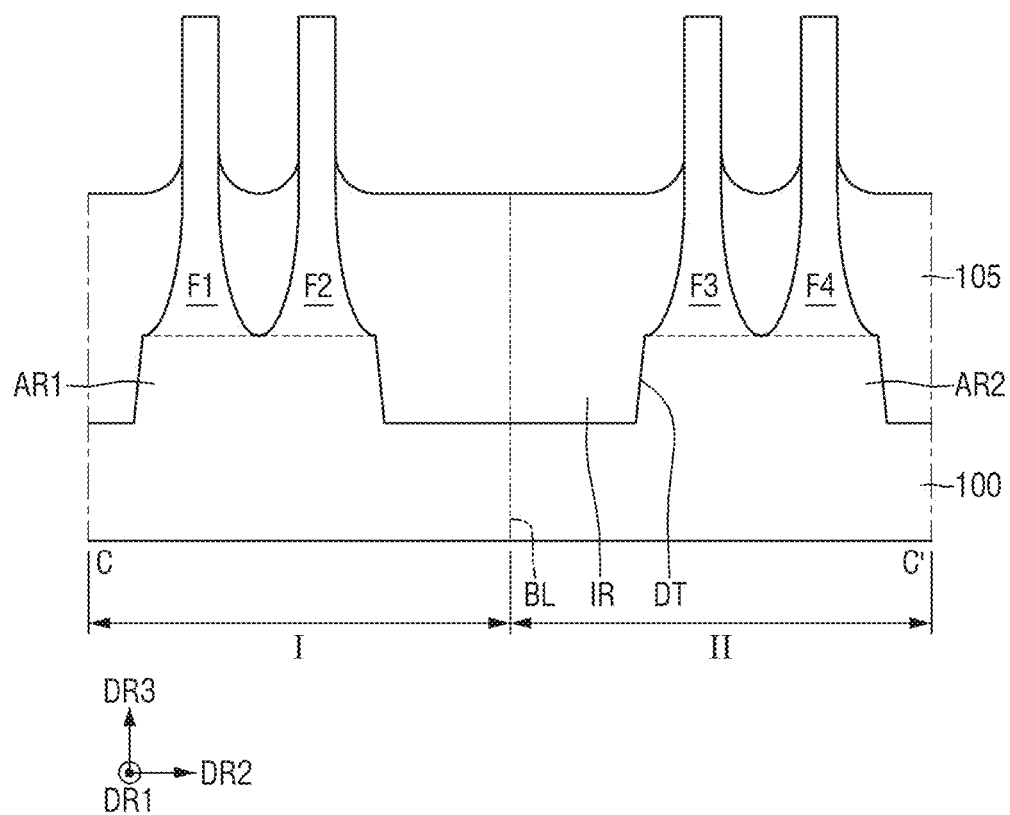

Referring to FIG. 6, the field insulating layer 105 may be formed on the substrate 100 to surround the side walls of the first active region AR1 and the side walls of the second active region AR2. The field insulating layer 105 may surround at least a part of side walls of each of the first to fourth active patterns F1, F2, F3 and F4.

Figure 7:
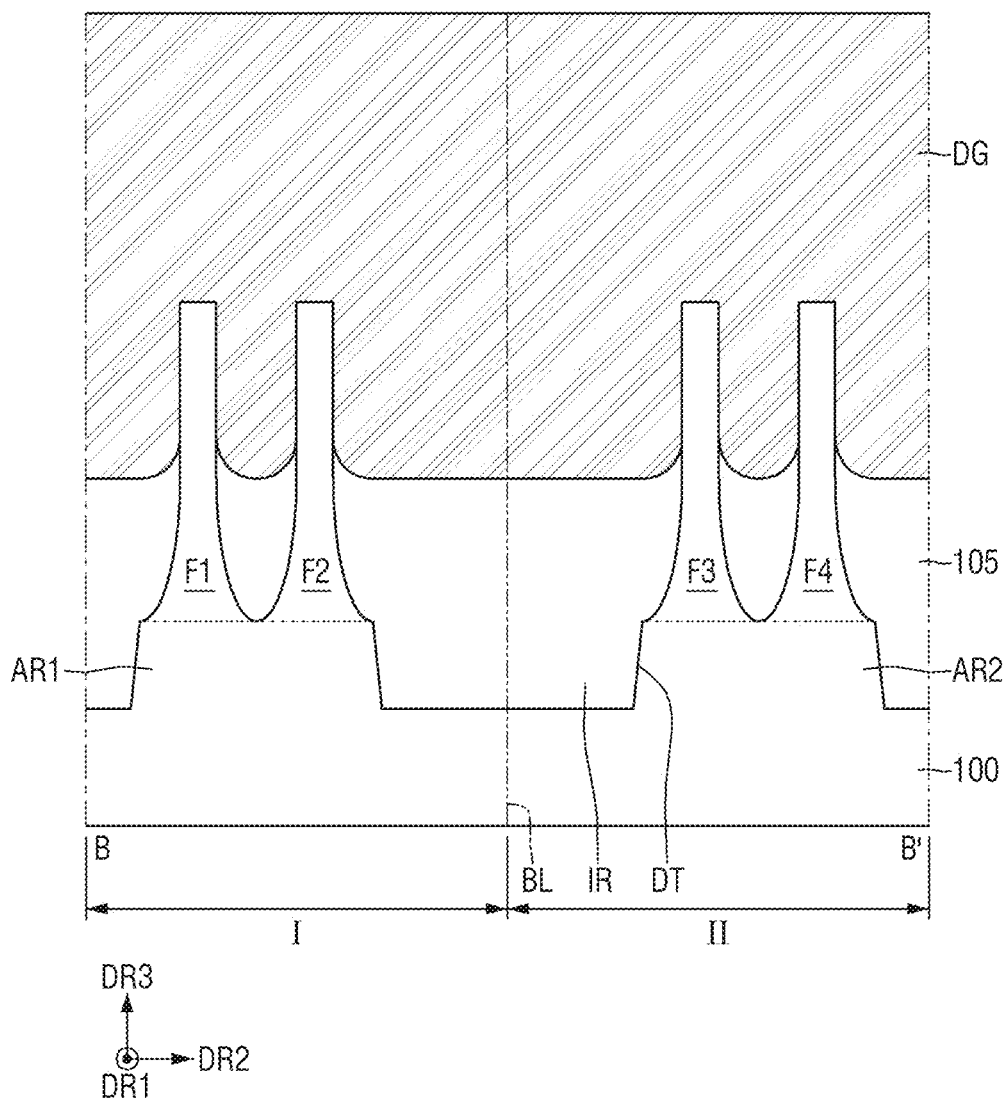

Referring to FIG. 7, a dummy gate DG extending in the second horizontal direction DR2 may be formed on the field insulating layer 105 and the first to fourth active patterns F1, F2, F3 and F4.

Figure 8:
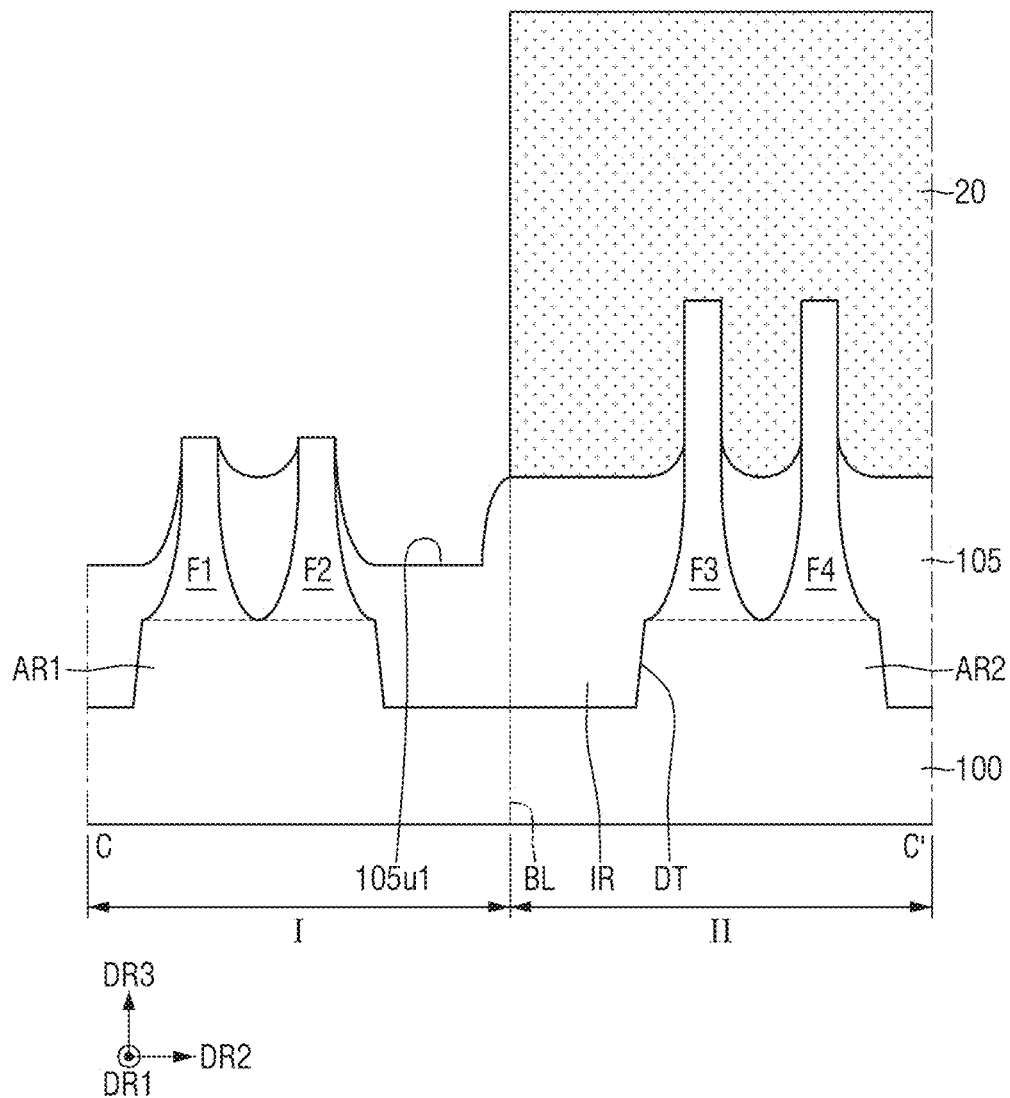

Referring to FIG. 8, a first protective layer 20 may be formed on the second region II of the portion in which the dummy gate DG is not formed. The first protective layer 20 is formed to cover the field insulating layer 105, the third active pattern F3, and the fourth active pattern F4 formed on the second region II.

Subsequently, a part of the field insulating layer 105 formed on the first region I may be etched. While a part of the field insulating layer 105 is etched, the field insulating layer 105 adjacent to a boundary line BL between the first region I and the second region II may not be etched. While a part of the field insulating layer 105 is etched, a part of the first active pattern F1 and a part of the second active pattern F2 exposed on the field insulating layer 105 may be etched.

Figure 9:
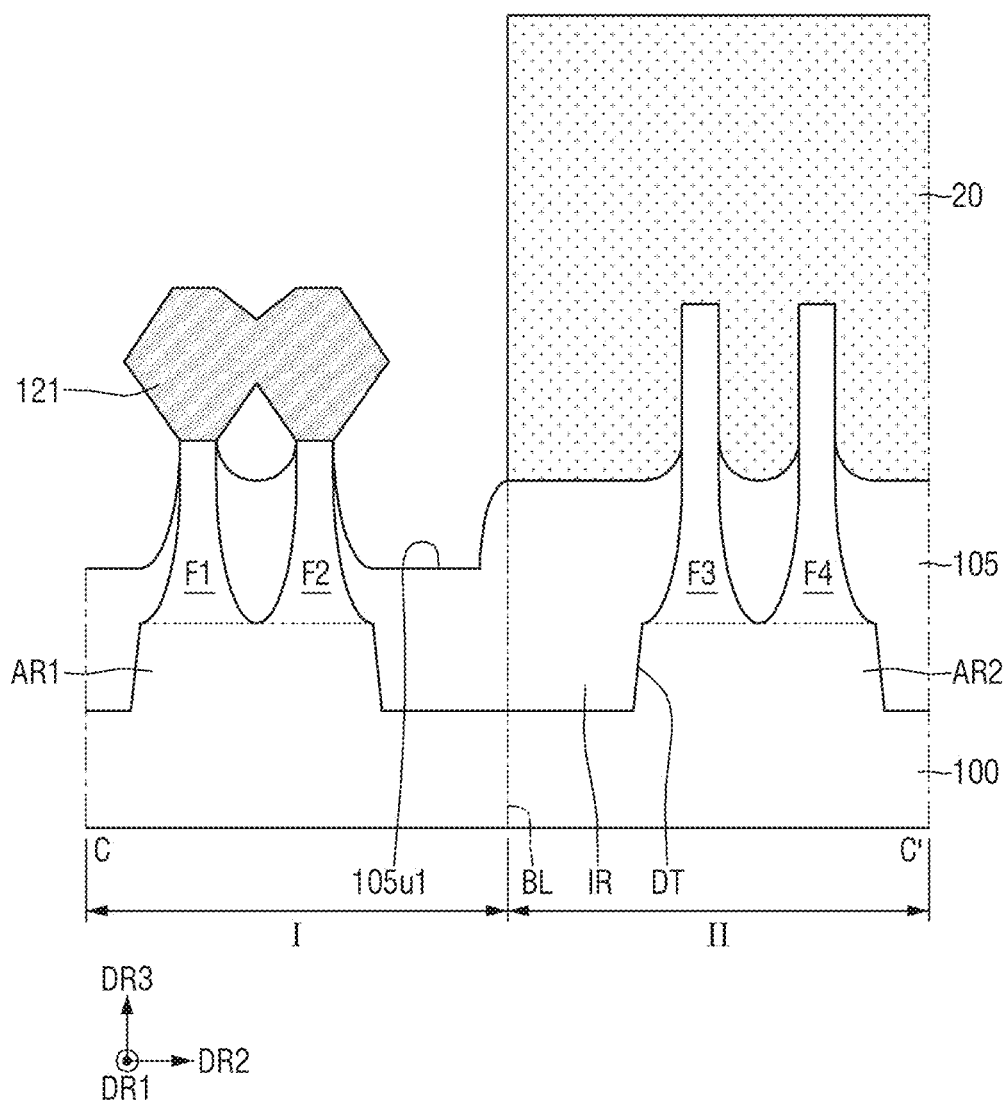

Referring to FIG. 9, a first source/drain region 121 may be formed on the first active pattern F1 and the second active pattern F2.

Figure 10:
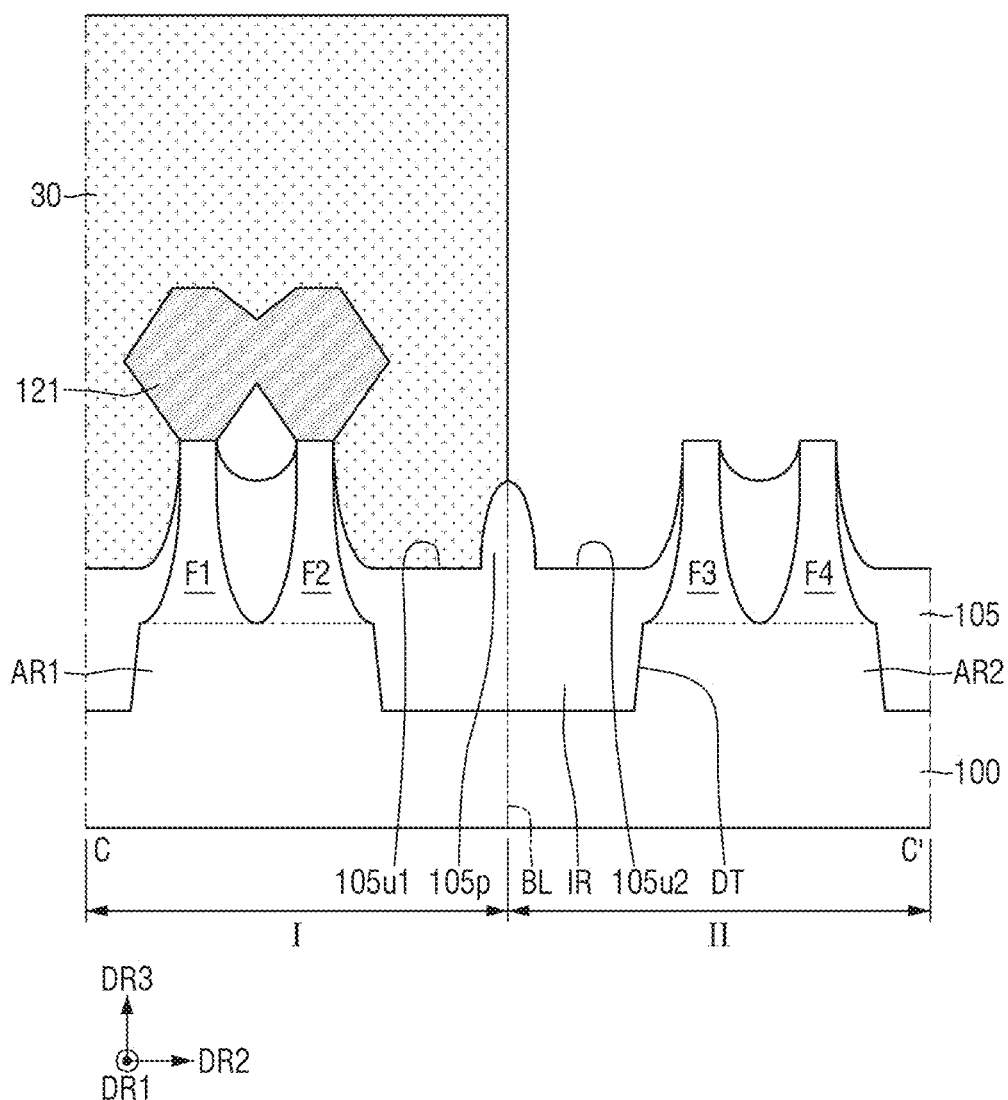

Referring to FIG. 10, a second protective layer 30 may be formed on the first region I of the portion in which the dummy gate DG is not formed. The second protective layer 30 may be formed to cover the field insulating layer 105 and the first source/drain region 121 formed on the first region I.

Subsequently, a part of the field insulating layer 105 formed on the second region II may be etched. While a part of the field insulating layer 105 is etched, the field insulating layer 105 adjacent to the boundary line BL between the first region I and the second region II may not be etched. Accordingly, a protrusion 105p protruding upwardly in the vertical direction DR3 may be formed on the boundary line BL between the first region I and the second region II. While a part of the field insulating layer 105 is etched, a part of the third active pattern F3 and a part of the fourth active pattern F4 exposed on the field insulating layer 105 may be etched.

Figure 11:
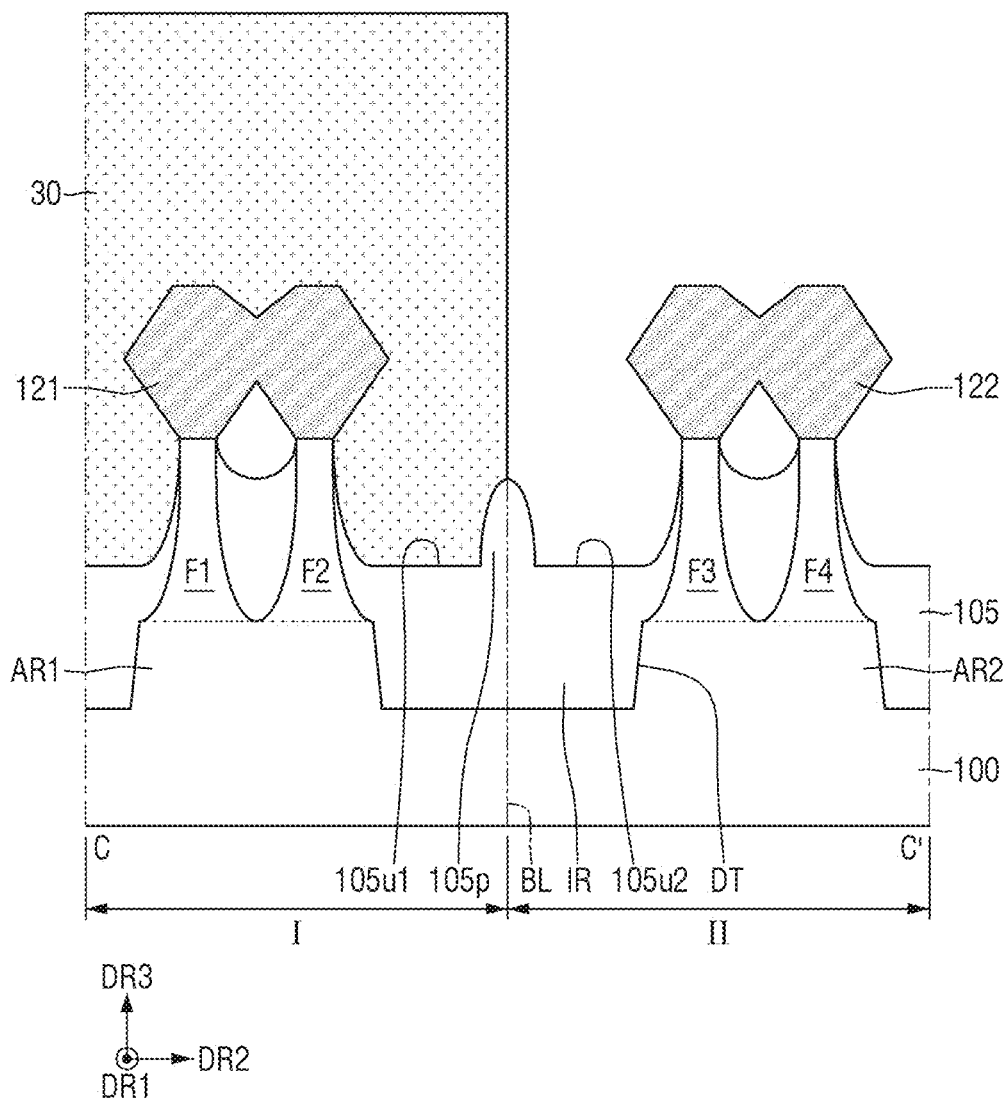

Referring to FIG. 11, a second source/drain region 122 may be formed on the third active pattern F3 and the fourth active pattern F4.

Figure 12:
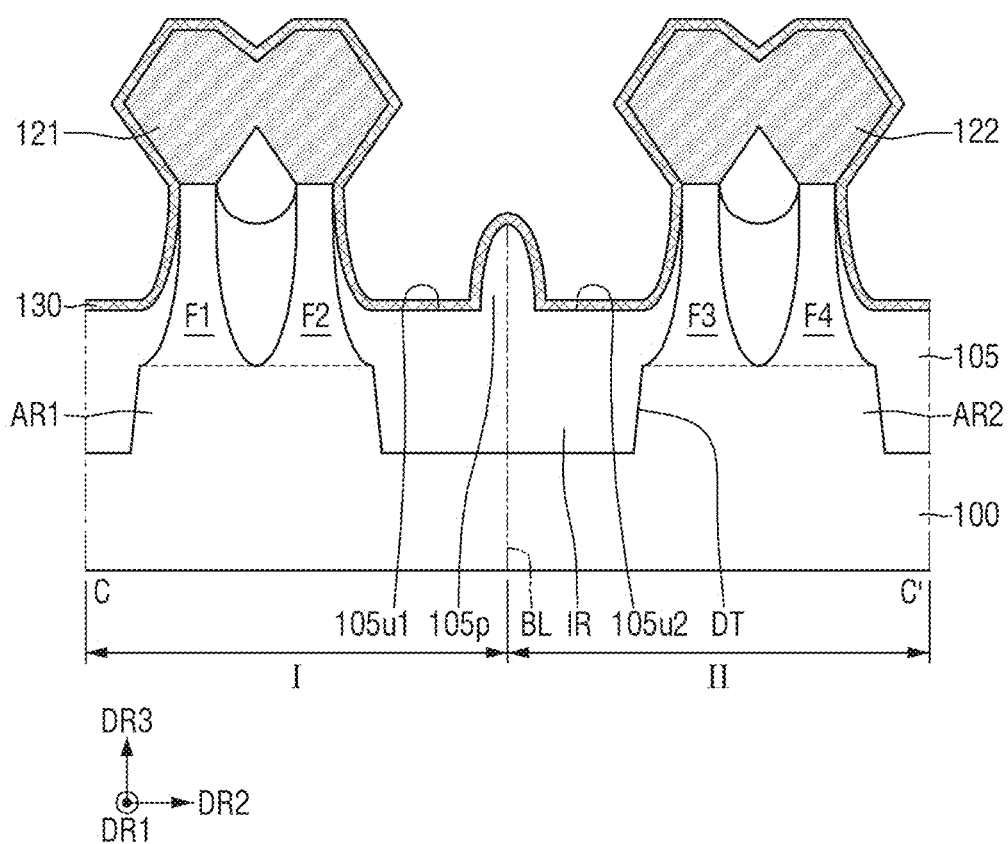

Referring to FIG. 12, the second protective layer 30 may be removed. Subsequently, the first etching stop layer 130 may be formed along the profile of the upper surface of the field insulating layer 105, the profile of the exposed first source/drain region 121, and the profile of the exposed second source/drain region 122.

For example, the first etching stop layer 130 may not be formed between the field insulating layer 105 and the first source/drain region 121, between the first active pattern F1 and the second active pattern F2. Further, the first etching stop layer 130 may not be formed between the field insulating layer 105 and the second source/drain region 122, between the third active pattern F3 and the fourth active pattern F4. However, the present disclosure is not limited thereto.

Figure 13:
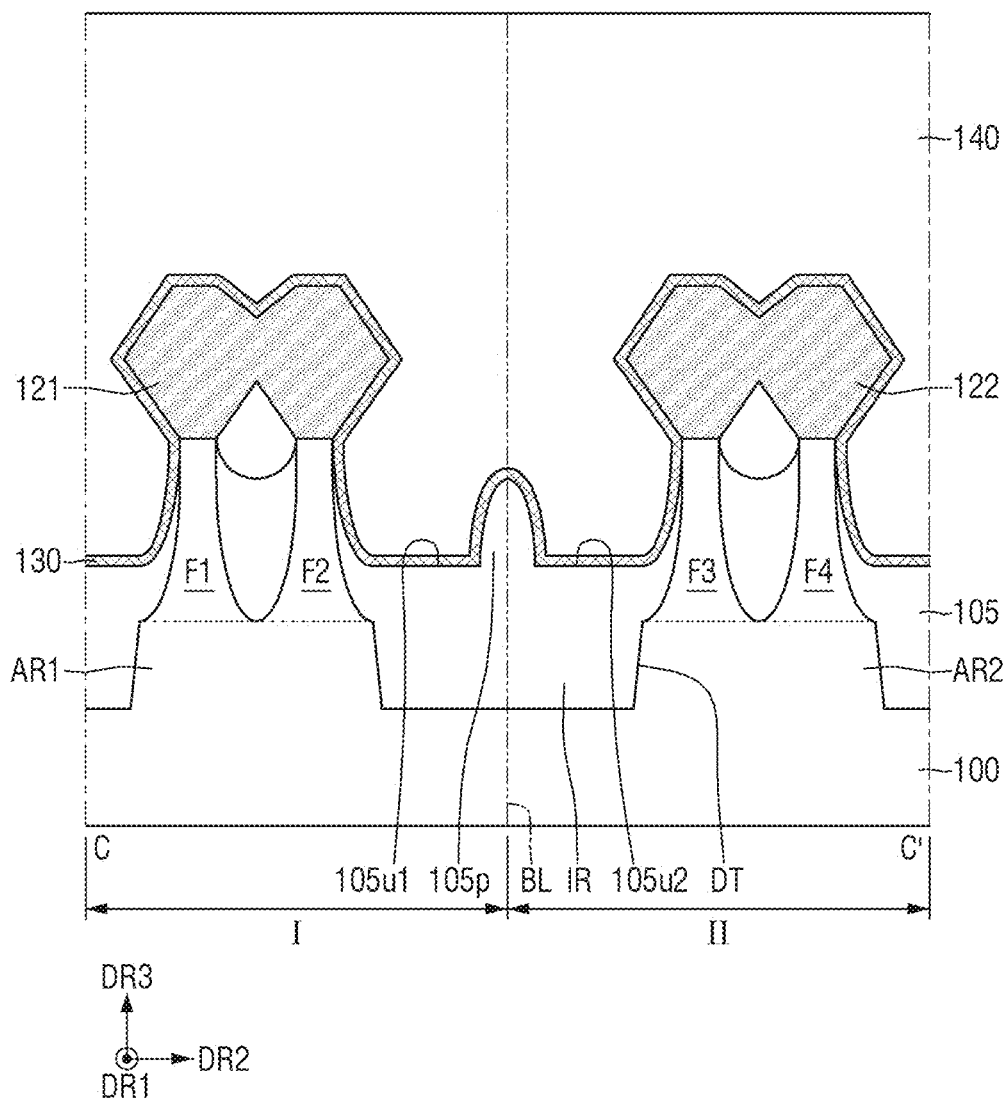

Referring to FIG. 13, the first interlayer insulating layer 140 may be formed on the first etching stop layer 130. The first interlayer insulating layer 140 may cover the side walls of the dummy gate (DG of FIG. 7).

Figure 14:
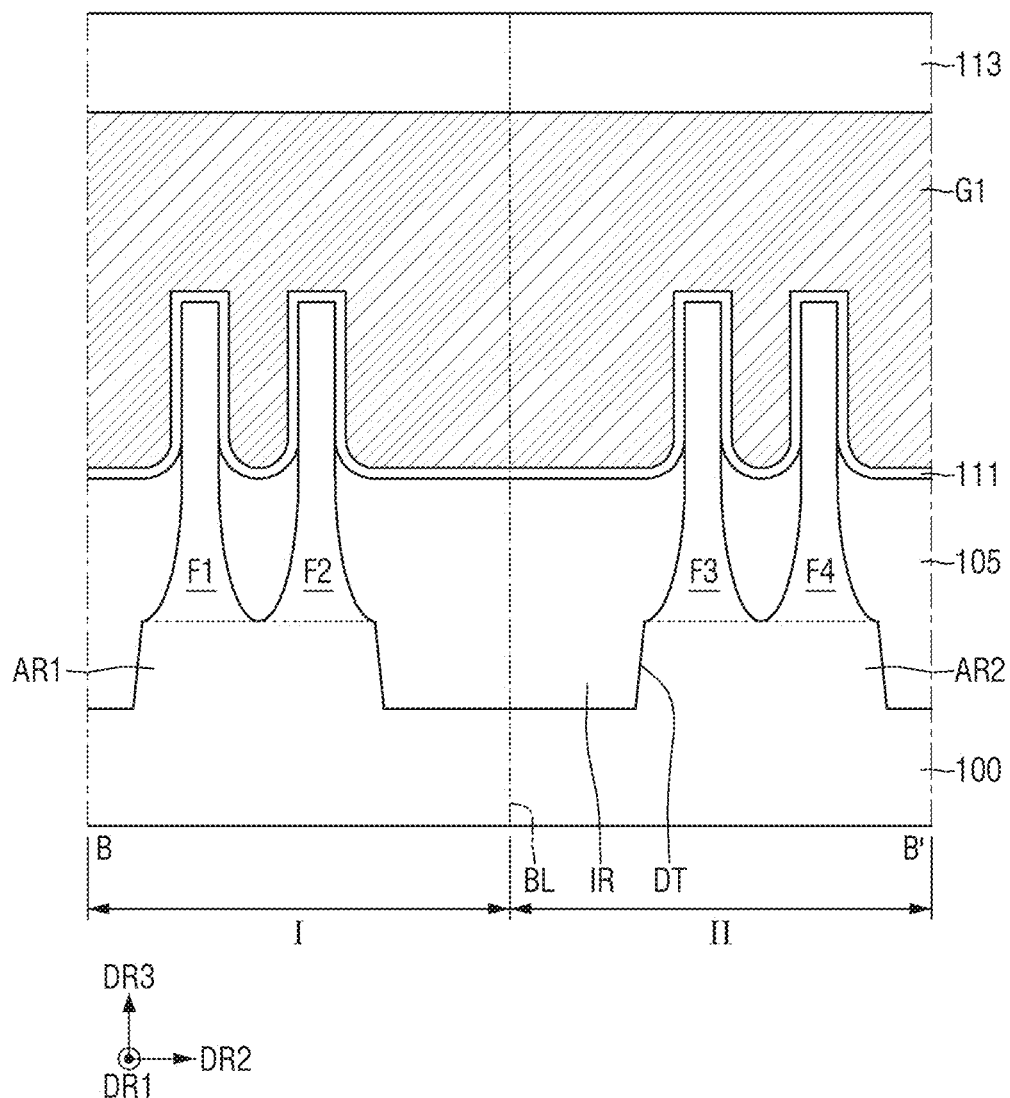

Referring to FIG. 14, the dummy gate (DG of FIG. 7) may be removed. Subsequently, the gate insulating layer 111, the first gate electrode G1, and the capping pattern 113 may be sequentially formed in the portion from which the dummy gate (DG of FIG. 7) is removed.

Figure 15:
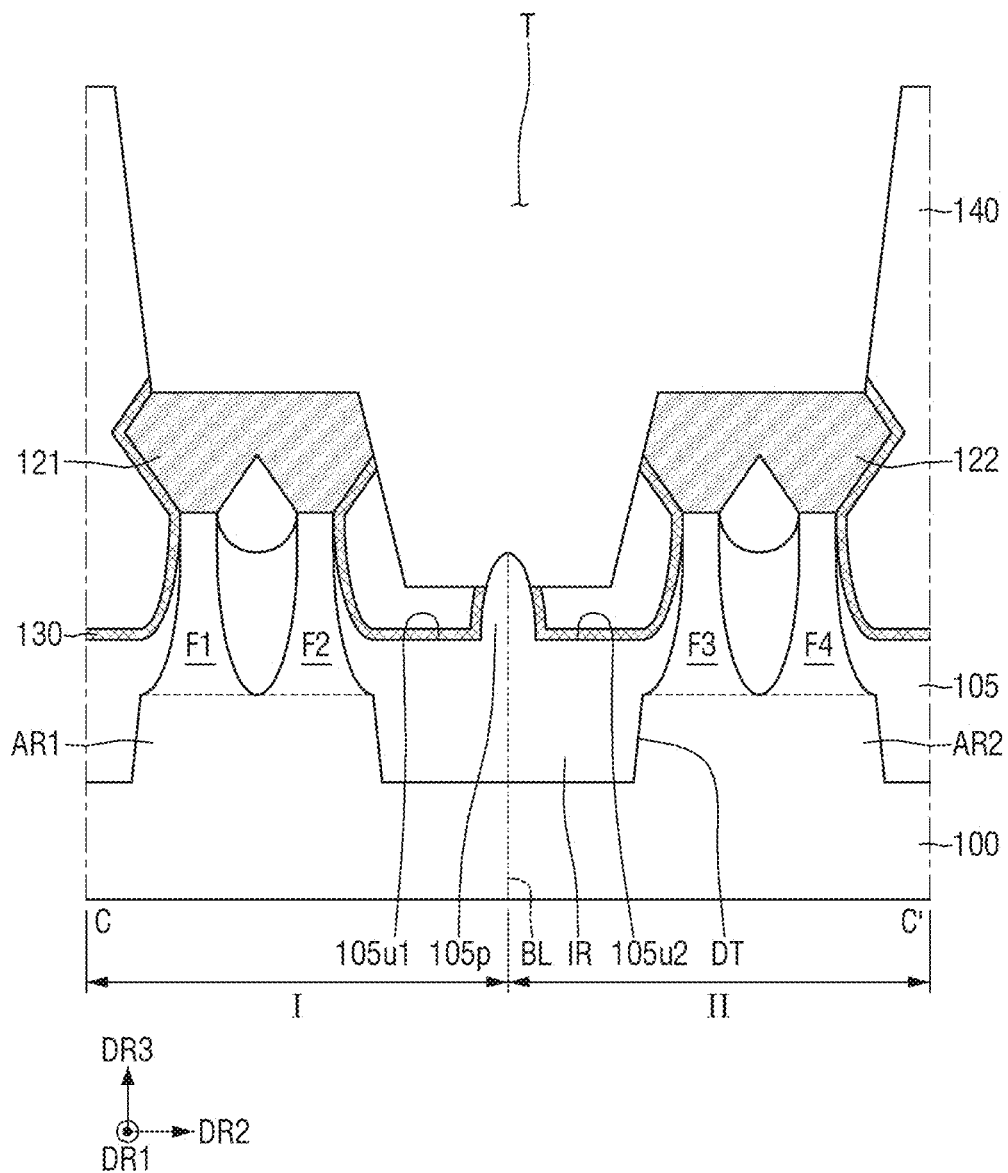

Referring to FIG. 15, a trench T which exposes the upper portion of the first source/drain region 121 and the upper portion of the second source/drain region 122 may be formed, by etching the first interlayer insulating layer 140. Further, the first etching stop layer 130 formed above the protrusion 105p may be etched. The upper portion of the protrusion 105p may be exposed by the trench T, accordingly.

Figure 16:
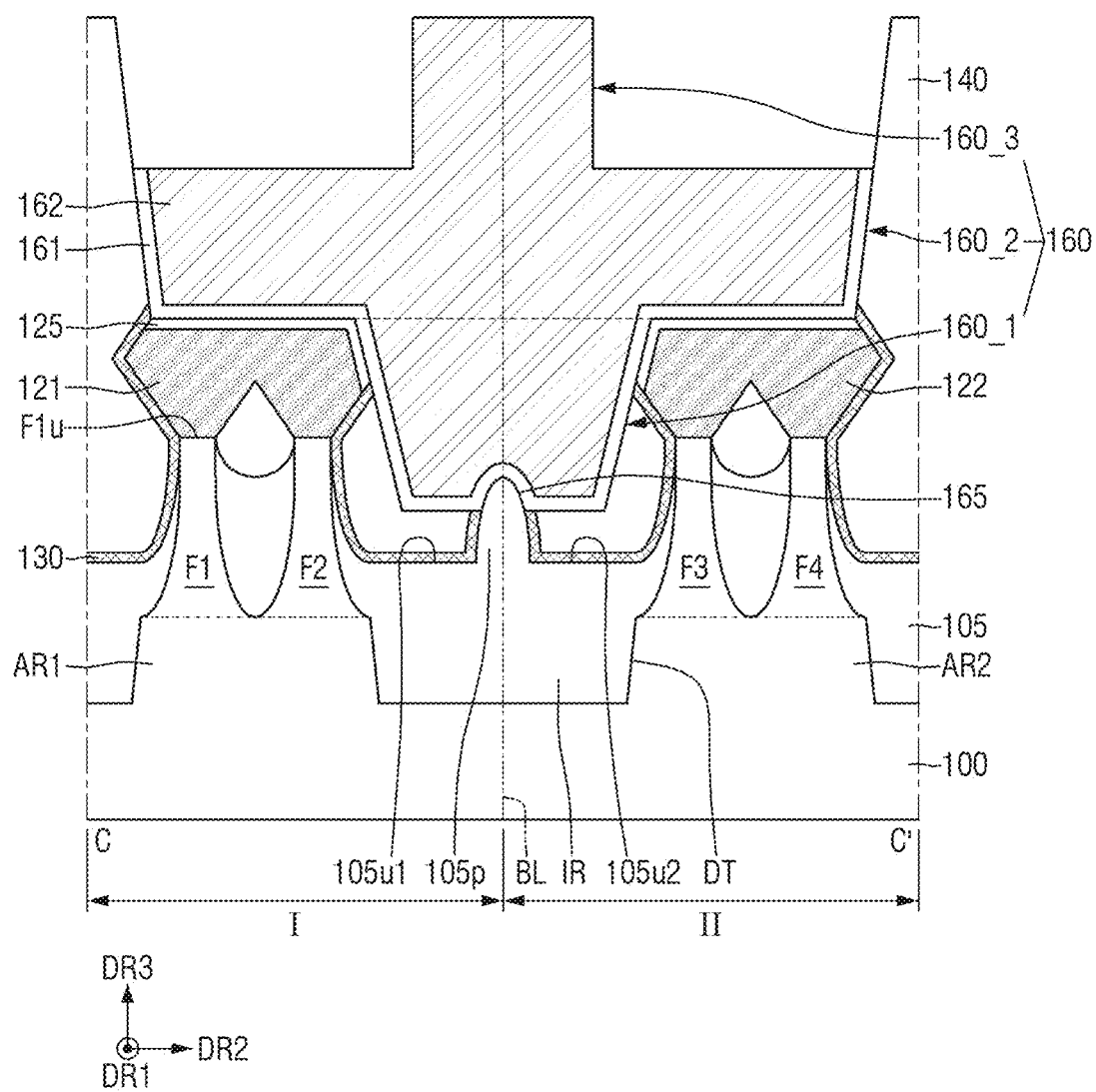

Referring to FIG. 16, a barrier layer 161 and a filling layer 162 may be sequentially formed inside the trench T. A part of upper portions of each of the barrier layer 161 and the filling layer 162 may then be etched. The first source/drain contact 160 including the first to third portions 160_1, 160_2 and 160_3 may be formed inside the trench T, accordingly.

Referring to FIG. 4, the first interlayer insulating layer 140 that surrounds the upper surface of the second portion 160_2 of the first source/drain contact 160 and the side walls of the third portion 160_3 of the first source/drain contact 160 may be additionally formed. Subsequently, a second etching stop layer 180, a second interlayer insulating layer 185, and a second via 192 are sequentially formed on the first interlayer insulating layer 140 and the first source/drain contact 160, and the semiconductor device shown in FIG. 4 may be fabricated.

Hereinafter, a semiconductor device according to some other example embodiments of the present disclosure will be described referring to FIG. 17. Differences from the semiconductor devices shown in FIGS. 1 to 4 will be mainly described.

Figure 17:
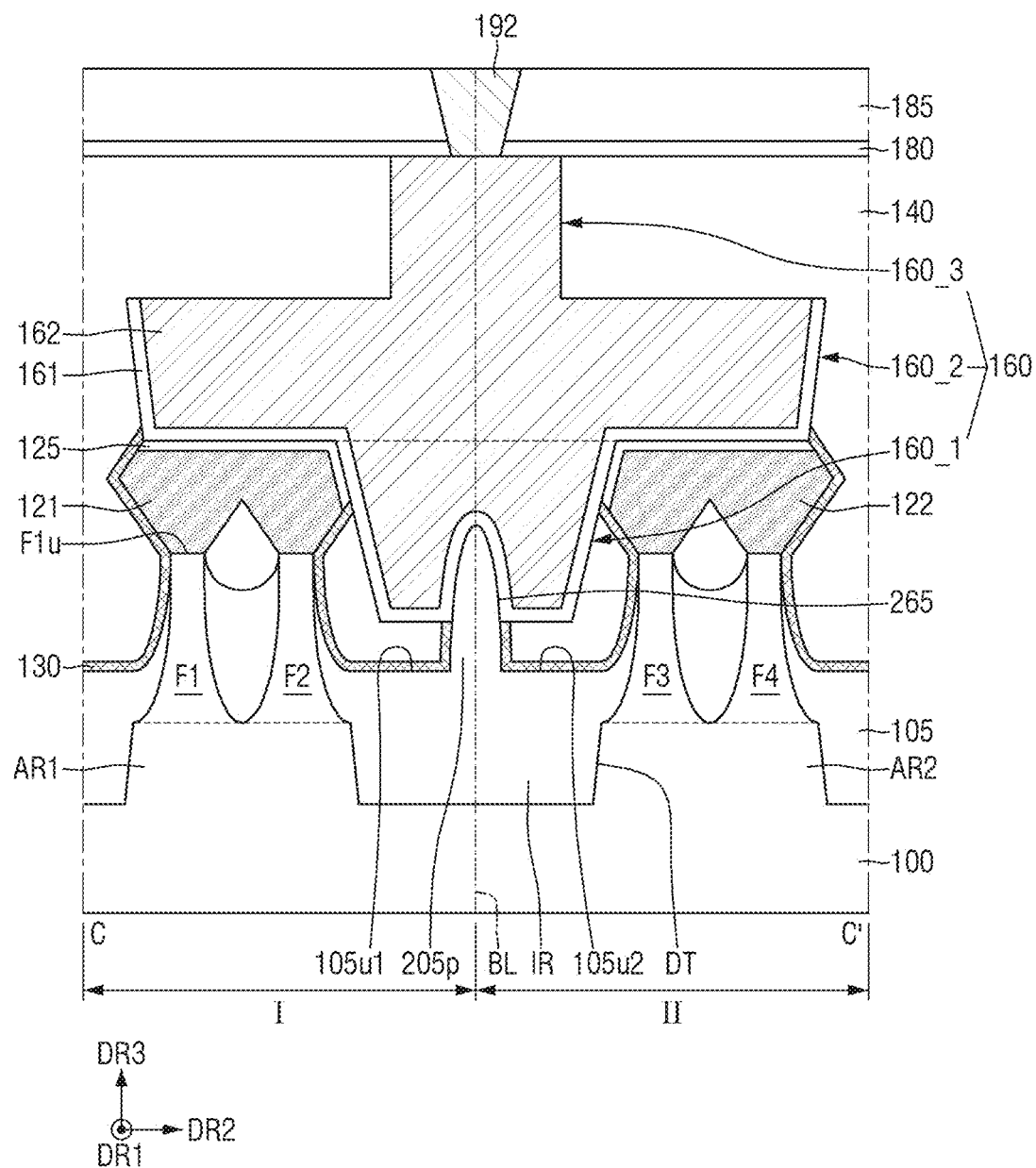
FIG. 17 is a cross-sectional view for explaining a semiconductor device according to some other example embodiments of the present disclosure.

FIG. 17 is a cross-sectional view for explaining a semiconductor device according to some other example embodiments of the present disclosure.

Referring to FIG. 17, in the semiconductor device according to some other example embodiment of the present disclosure, an upper portion of a protrusion 205p may be higher than an upper surface Flu of the first active pattern F1 that is in contact with the first source/drain region 121. At least a part of the protrusion 205p may be disposed inside a recess 265 formed on the lower surface of the first portion 160_1 of the first source/drain contact 160.

Hereinafter, a semiconductor device according to some other example embodiments of the present disclosure will be described referring to FIG. 18. Differences from the semiconductor devices shown in FIGS. 1 to 4 will be mainly described.

Figure 18:
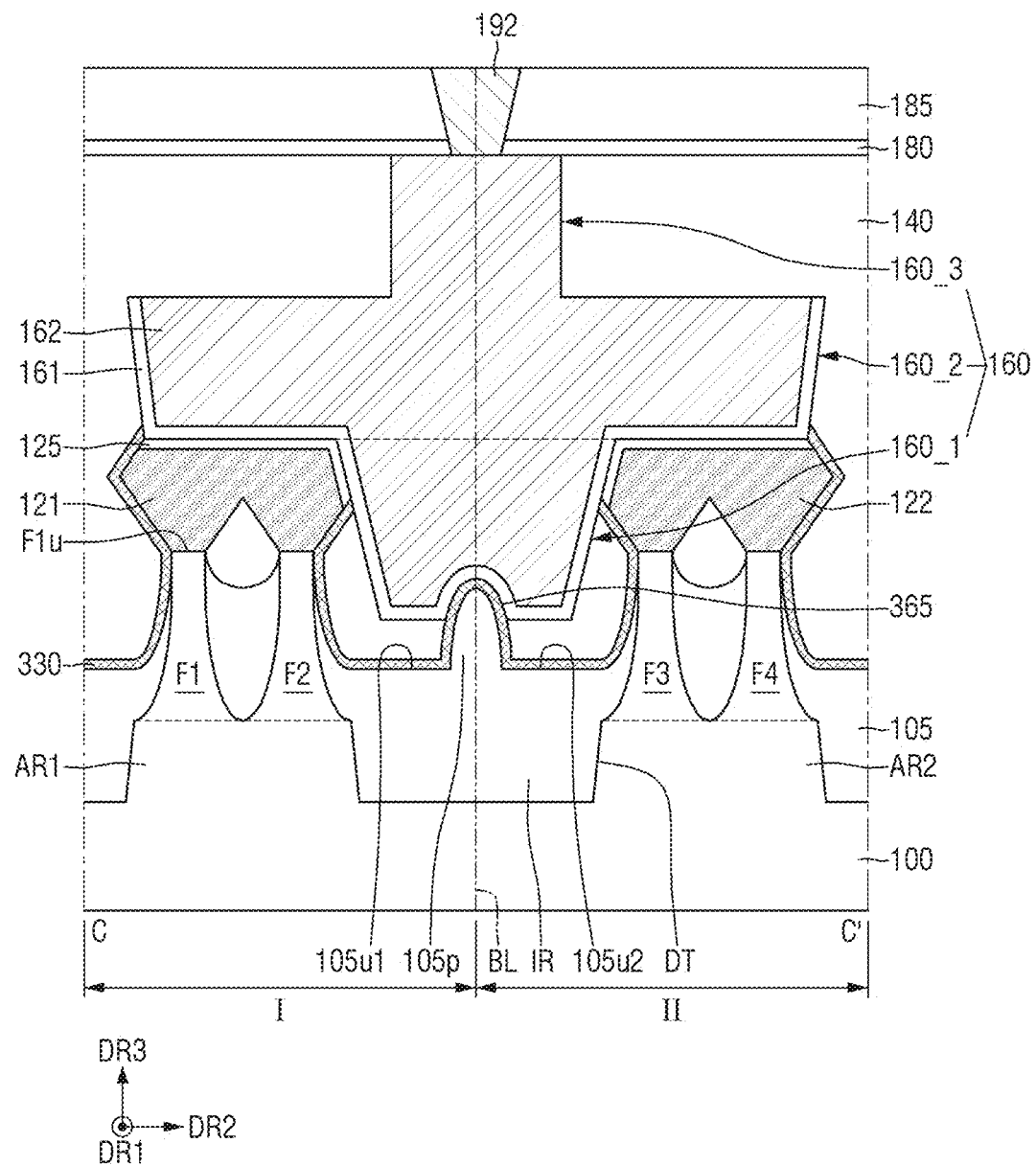
FIG. 18 is a cross-sectional view for explaining a semiconductor device according to some other example embodiments of the present disclosure.

FIG. 18 is a cross-sectional view for explaining a semiconductor device according to some other example embodiments of the present disclosure.

Referring to FIG. 18, in the semiconductor device according to some other example embodiment of the present disclosure, a first etching stop layer 330 may be disposed between the protrusion 105p and the first portion 160_1 of the first source/drain contact 160, inside a recess 365 formed on the lower surface of the first portion 160_1 of the first source/drain contact 160. The first etching stop layer 330 may be in contact with each of the first portion 160_1 of the first source/drain contact 160 and the protrusion 105p, inside the recess 365.

Hereinafter, a semiconductor device according to some other example embodiments of the present disclosure will be described referring to FIG. 19. Differences from the semiconductor device shown in FIGS. 1 to 4 will be mainly described.

Figure 19:
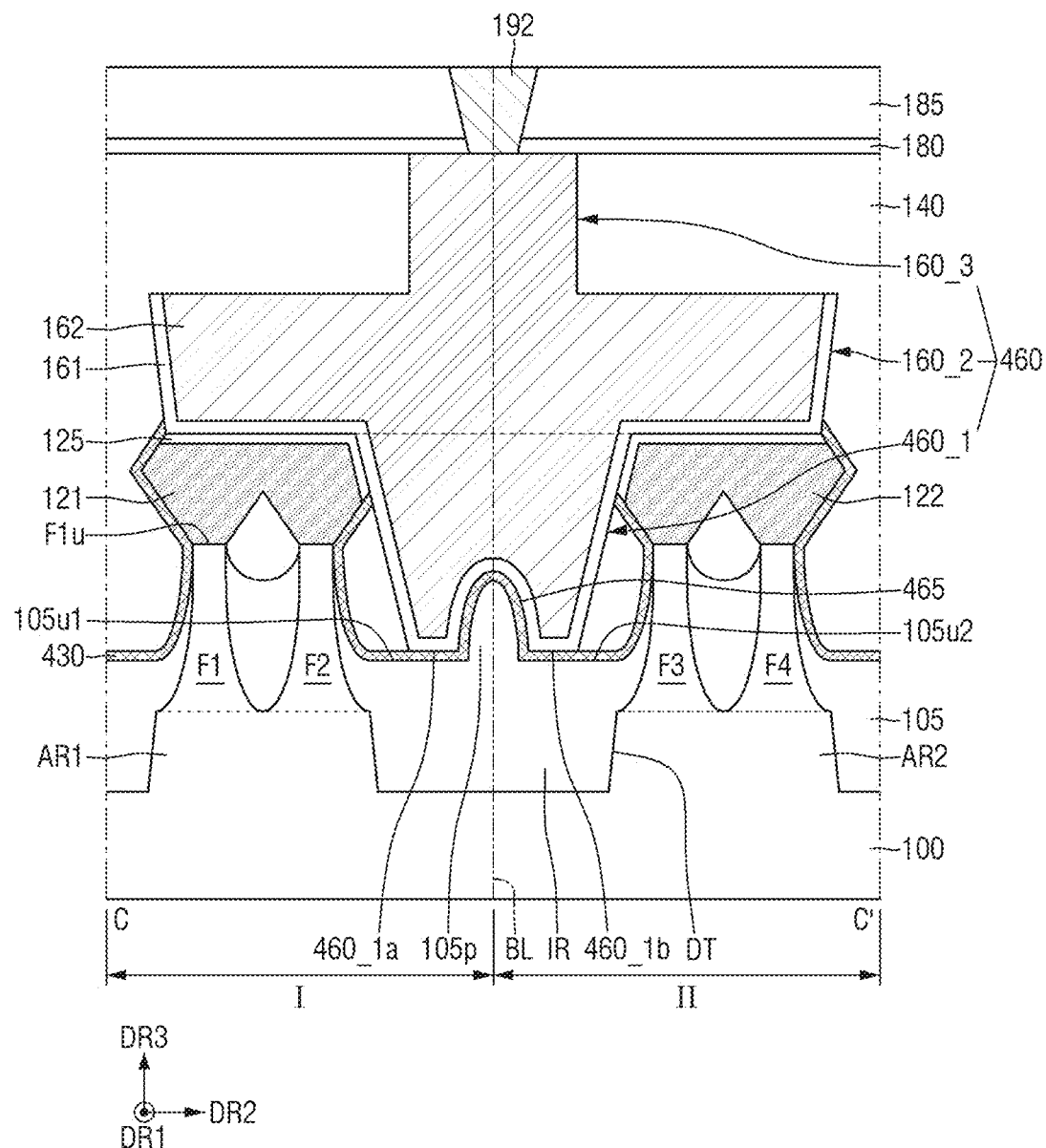
FIG. 19 is a cross-sectional view for explaining a semiconductor device according to some other example embodiments of the present disclosure.

FIG. 19 is a cross-sectional view for explaining a semiconductor device according to some other example embodiments of the present disclosure.

Referring to FIG. 19, in the semiconductor device according to some other example embodiment of the present disclosure, a lower surface of a first portion 460_1 of a first source/drain contact 460 may extend to a first etching stop layer 430 disposed on the upper surface of the field insulating layer 105 adjacent to the protrusion 105p.

For example, a first lower surface 460_1a of the first portion 460_1 of the first source/drain contact 460 formed on the one side of the recess 465 may be in contact with the first etching stop layer 430 disposed on the first upper surface 105u1 of the field insulating layer 105 that is between the protrusion 105p and the first active region AR1. Further, a second lower surface 460_1b of the first portion 460_1 of the first source/drain contact 460 formed on the other side of the recess 465 may be in contact with the first etching stop layer 430 disposed on the second upper surface 105u2 of the field insulating layer 105 that is between the protrusion 105p and the second active region AR2.

The first etching stop layer 430 may be disposed between the protrusion 105p and the first portion 460_1 of the first source/drain contact 460, inside the recess 465 formed on the lower surface of the first portion 460_1 of the first source/drain contact 460. The first etching stop layer 430 may be in contact with each of the first portion 460_1 of the first source/drain contact 460 and the protrusion 105p inside the recess 465.

Hereinafter, a semiconductor device according to some other example embodiments of the present disclosure will be described referring to FIG. 20. Differences from the semiconductor device shown in FIGS. 1 to 4 will be mainly described.

Figure 20:
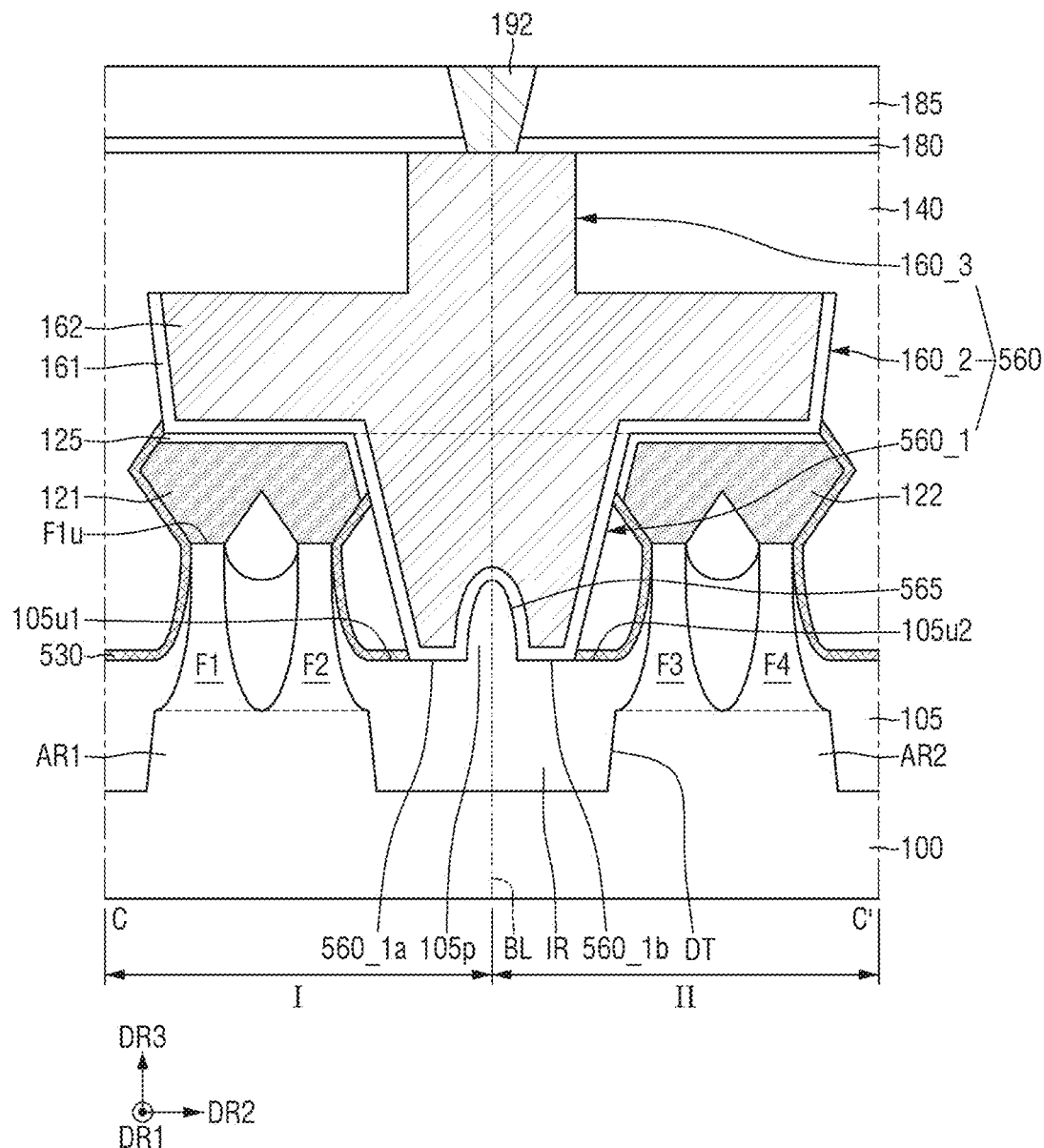
FIG. 20 is a cross-sectional view for explaining a semiconductor device according to some other example embodiments of the present disclosure.

FIG. 20 is a cross-sectional view for explaining a semiconductor device according to some other example embodiments of the present disclosure.

Referring to FIG. 20, in the semiconductor device according to some other example embodiment of the present disclosure, the lower surface of the first portion 560_1 of the first source/drain contact 560 may extend to the upper surface of the field insulating layer 105 adjacent to the protrusion 105p.

For example, a first lower surface 560_1a of the first portion 560_1 of the first source/drain contact 560 formed on the one side of the recess 565 may be in contact with the first upper surface 105u1 of the field insulating layer 105 between the protrusion 105p and the first active region AR1. Further, a second lower surface 560_1b of the first portion 560_1 of the first source/drain contact 560 formed on the other side of the recess 565 may be in contact with the second upper surface 105u2 of the field insulating layer 105 between the protrusion 105p and the second active region AR2.

The first etching stop layer 530 is not disposed inside the recess 565. The first portion 560_1 of the first source/drain contact 560 may be in contact with the protrusion 105p inside the recess 565.

Hereinafter, a semiconductor device according to some other example embodiments of the present disclosure will be described referring to FIG. 21. Differences from the semiconductor device shown in FIGS. 1 to 4 will be mainly described.

Figure 21:
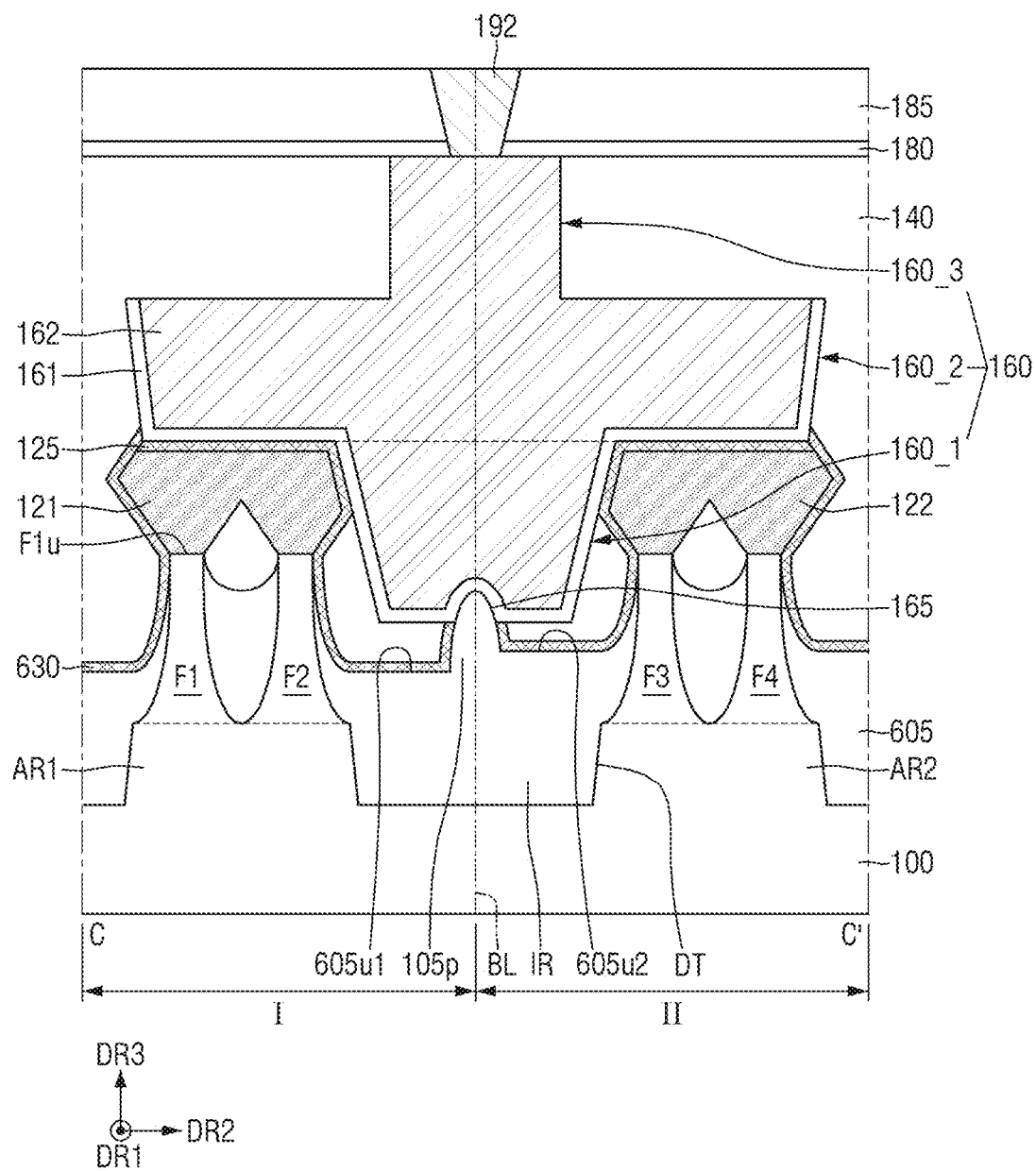
FIG. 21 is a cross-sectional view for explaining a semiconductor device according to some other example embodiments of the present disclosure.

FIG. 21 is a cross-sectional view for explaining a semiconductor device according to some other example embodiments of the present disclosure.

Referring to FIG. 21, in the semiconductor device according to some other example embodiments of the present disclosure, a field insulating layer 605 may include a first upper surface 605u1 formed between the first active region AR1 and the protrusion 105*p*, and a second upper surface 605*u*2 formed between the second active region AR2 and the protrusion 105*p*.

The first upper surface 605*u*1 of the field insulating layer 605 and the second upper surface 605*u*2 of the field insulating layer 605 may be formed at different heights from each other. For example, the second upper surface 605*u*2 of the field insulating layer 605 may be higher than the first upper surface 605*u*1 of the field insulating layer 605. The first etching stop layer 630 may be disposed along the first upper surface 605*u*1 of the field insulating layer 605 and the second upper surface 605*u*2 of the field insulating layer 605.

Hereinafter, a semiconductor device according to some other example embodiments of the present disclosure will be described referring to FIG. 22. Differences from the semiconductor device shown in FIG. 21 will be mainly described.

Figure 22:
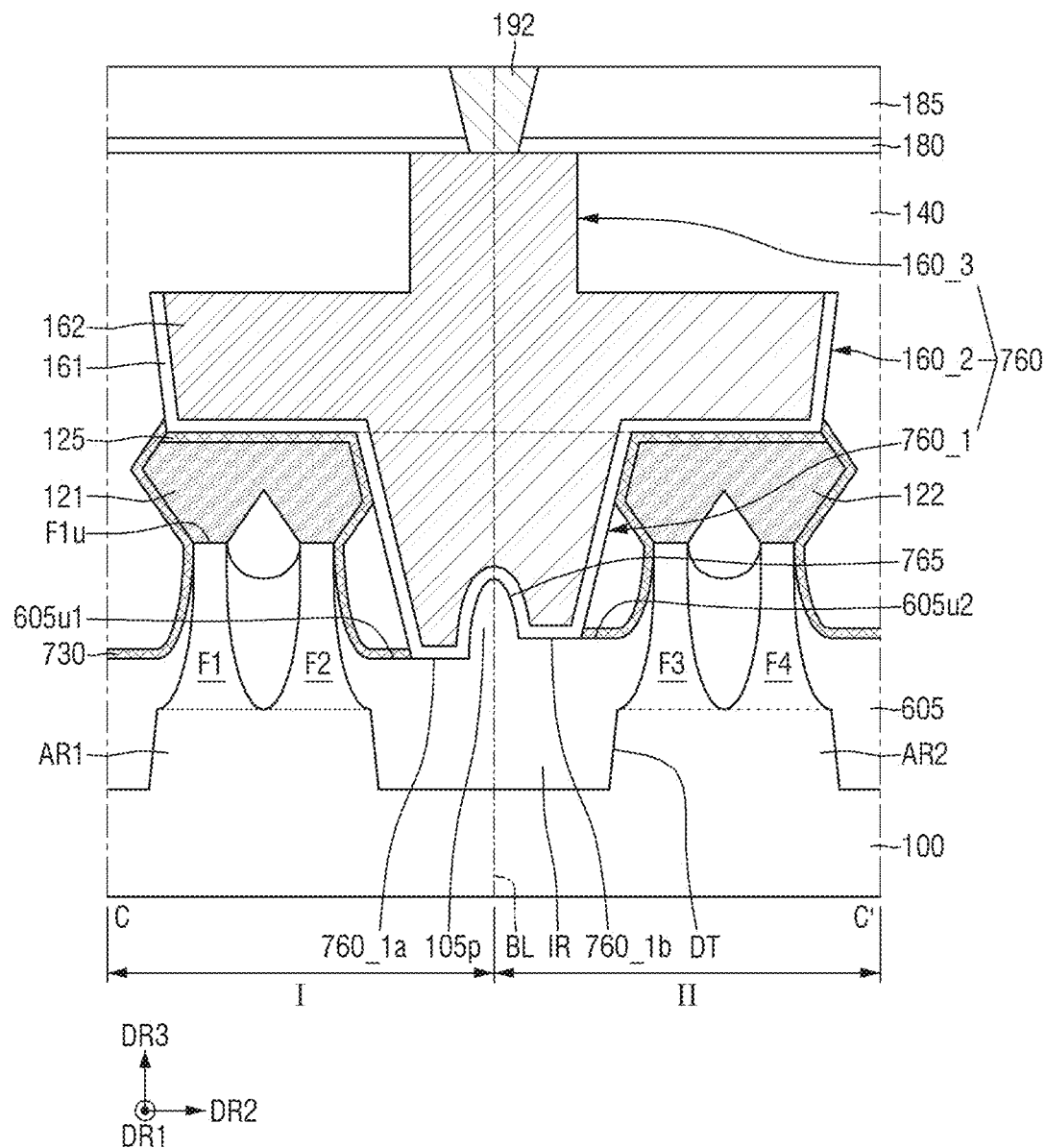
FIG. 22 is a cross-sectional view for explaining a semiconductor device according to some other example embodiments of the present disclosure.

FIG. 22 is a cross-sectional view for explaining a semiconductor device according to some other example embodiments of the present disclosure.

Referring to FIG. 22, in a semiconductor device according to some other example embodiment of the present disclosure, a first portion 760_1 of a first source/drain contact 760 may include a first lower surface 760_1*a* that faces (e.g., is in contact with) the first upper surface 605*u*1 of the field insulating layer 605, and a second lower surface 760_1*b* that faces (or is in contact with) the second upper surface 605*u*2 of the field insulating layer 605.

The second lower surface 760_1*b* of the first portion 760_1 of the first source/drain contact 760 may be higher than the first lower surface 760_1*a* of the first portion 760_1 of the first source/drain contact 760.

The first lower surface 760_1*a* of the first portion 760_1 of the first source/drain contact 760 may be in contact with the first upper surface 605*u*1 of the field insulating layer 605. Further, the second lower surface 760_1*b* of the first portion 760_1 of the first source/drain contact 760 may be in contact with the second upper surface 605*u*2 of the field insulating layer 605. The first etching stop layer 730 is not disposed inside the recess 765. The first portion 760_1 of the first source/drain contact 760 may be in contact with the protrusion 105*p* inside the recess 765.

Hereinafter, a semiconductor device according to some other example embodiments of the present disclosure will be described referring to FIG. 23. Differences from the semiconductor devices shown in FIGS. 1 to 4 will be mainly described.

Figure 23:
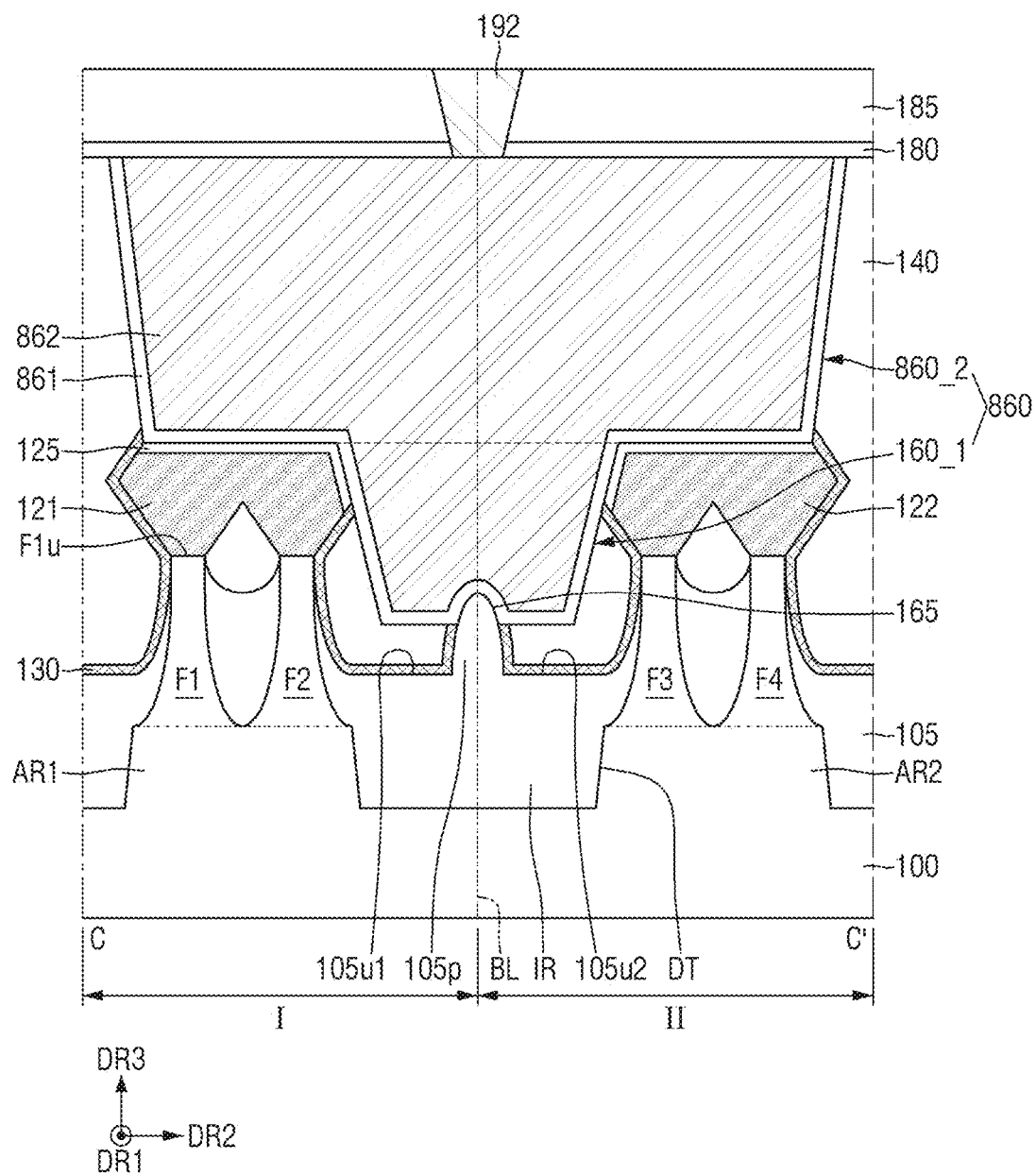
FIG. 23 is a cross-sectional view for explaining a semiconductor device according to some other example embodiments of the present disclosure.

FIG. 23 is a cross-sectional view for explaining a semiconductor device according to some other example embodiments of the present disclosure.

Referring to FIG. 23, in the semiconductor device according to some other example embodiment of the present disclosure, a first source/drain contact 860 may include a first portion 160_1, and a second portion 860_2 disposed on the first portion 160_1. The side walls of the second portion 860_2 of the first source/drain contact 860 may extend towards the second etching stop layer 180 to have a constant slope profile.

A barrier layer 861 may form side walls and a bottom surface of the first source/drain contact 860. A filling layer 862 may be disposed on the barrier layer 861.

Hereinafter, a semiconductor device according to some other example embodiments of the present disclosure will be described referring to FIGS. 24 to 27. Differences from the semiconductor devices shown in FIGS. 1 to 4 will be mainly described.

Figure 24:
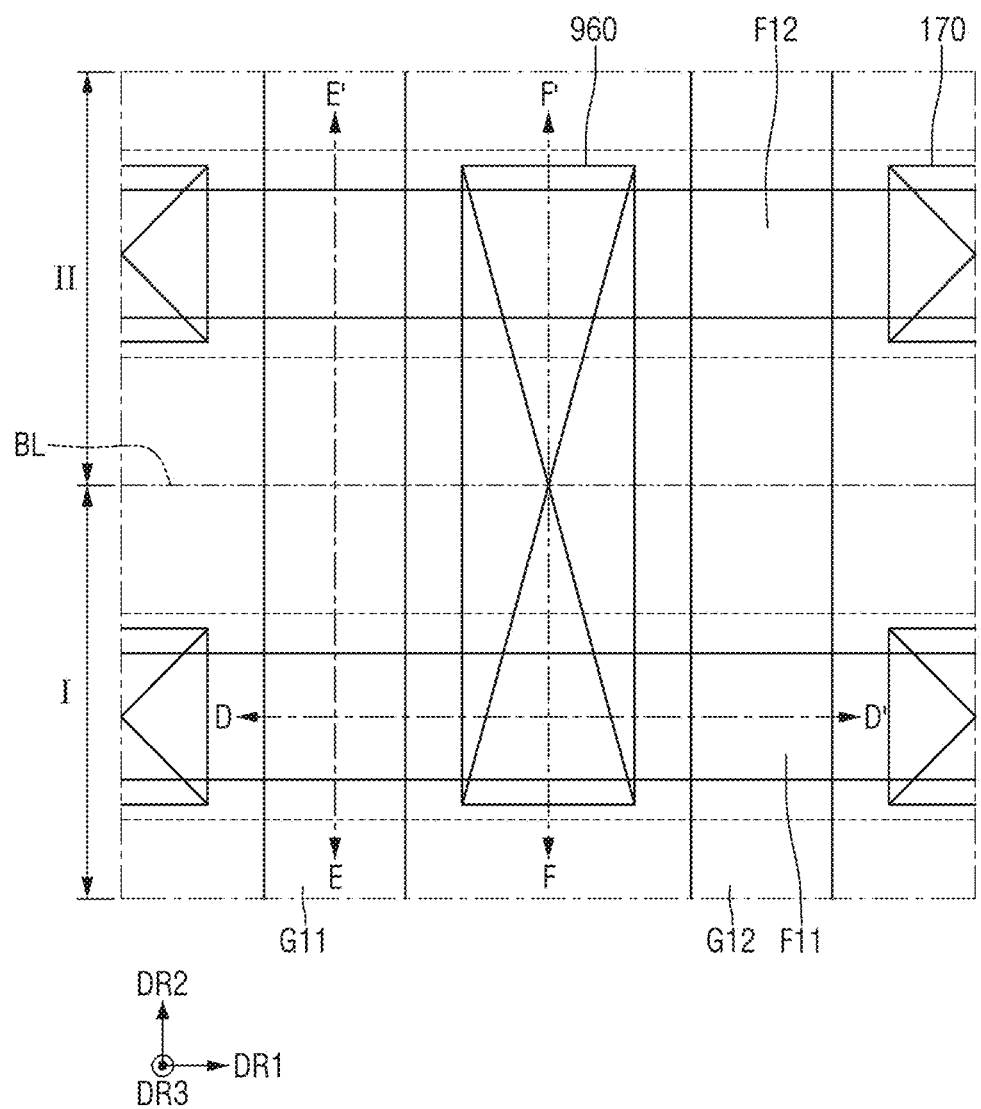
FIG. 24 is a layout diagram for explaining a semiconductor device according to some other example embodiments of the present disclosure.
Figure 25:
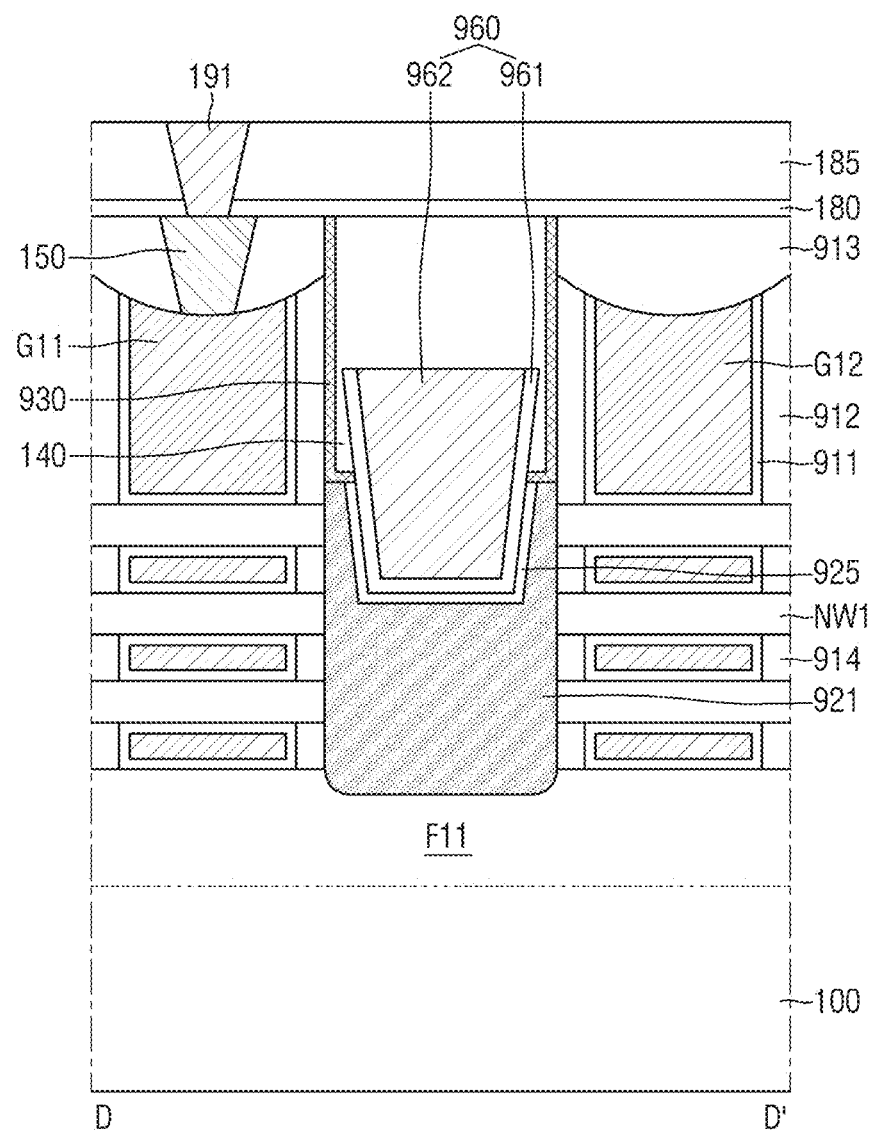
FIG. 25 is a cross-sectional view taken along a line D-D' of FIG. 24
Figure 26:
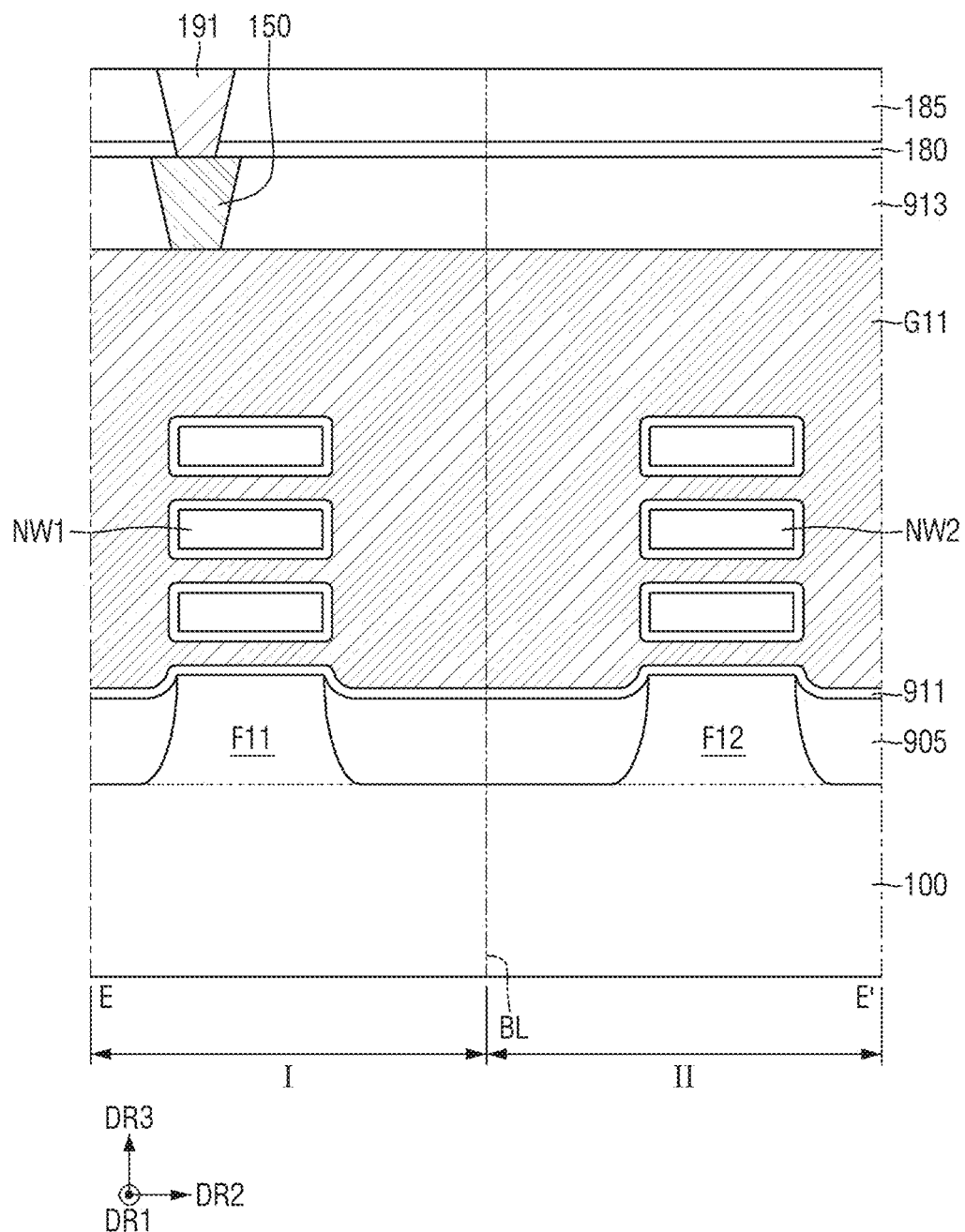
FIG. 26 is a cross-sectional view taken along a line E-E' of FIG. 24.
Figure 27:
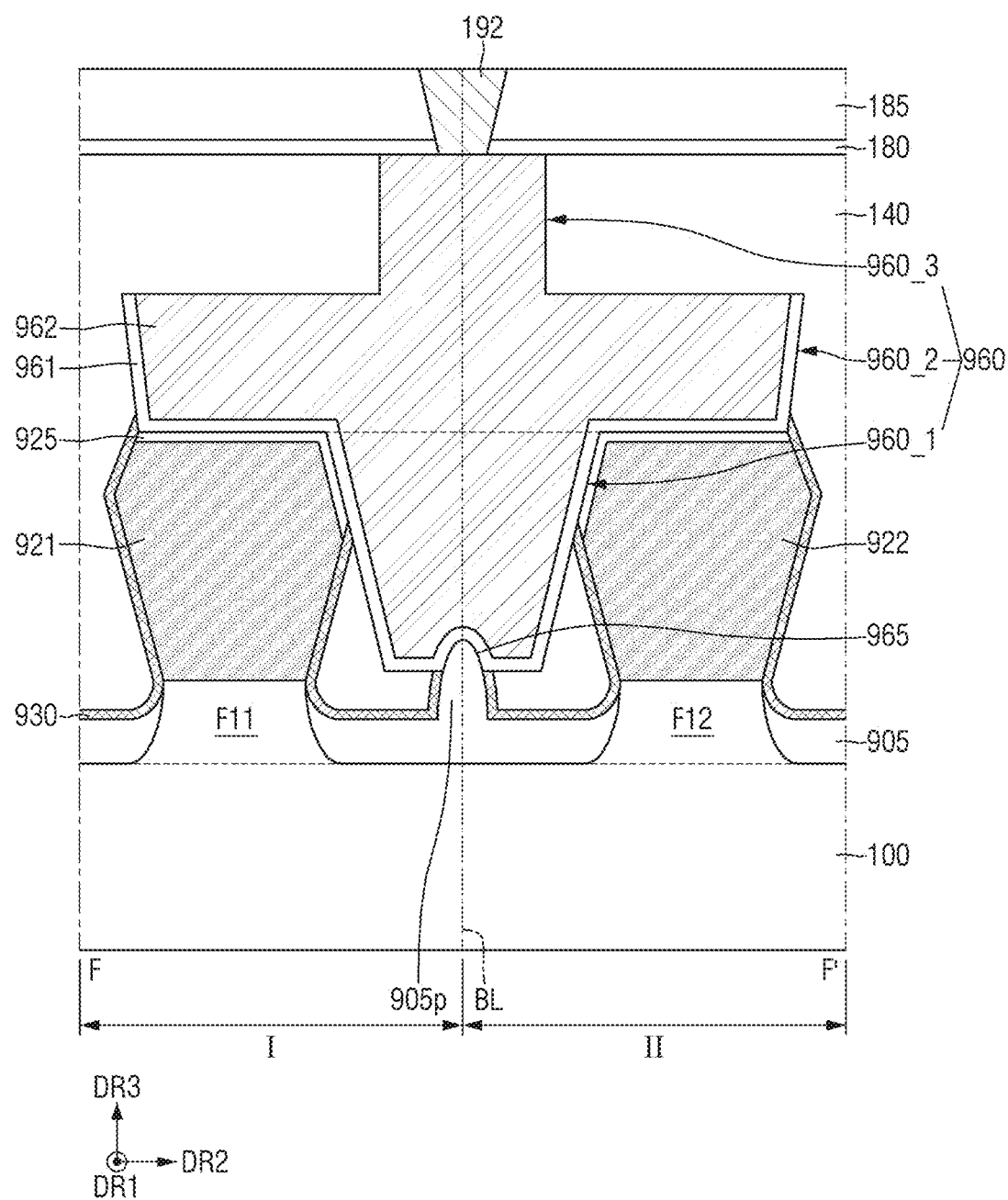
FIG. 27 is a cross-sectional view taken along a line F-F' of FIG. 24.

FIG. 24 is a layout diagram for explaining a semiconductor device according to some other example embodiments of the present disclosure. FIG. 25 is a cross-sectional view taken along a line D-D' of FIG. 24. FIG. 26 is a cross-sectional view taken along a line E-E' of FIG. 24. FIG. 27 is a cross-sectional view taken along a line F-F' of FIG. 24.

Referring to FIGS. 24 to 27, the semiconductor device according to some other example embodiment of the present disclosure may include an MBC FET™ (Multi-Bridge Channel Field Effect Transistor) including a plurality of nanosheets. For example, the semiconductor device according to some other example embodiments of the present disclosure includes a substrate 100, first and second active patterns F11 and F12, a field insulating layer 905, a first plurality of nanosheets NW1, a second plurality of nanosheets NW2, first and second gate electrodes G11 and G12, a gate insulating layer 911, a gate spacer 912, a capping pattern 913, an internal spacer 914, a first source/drain region 921, a second source/drain region 922, a silicide layer 925, a first etching stop layer 930, a first interlayer insulating layer 140, a gate contact 150, a first source/drain contact 960, a second source/drain contact 170, a second etching stop layer 180, a second interlayer insulating layer 185, a first via 191, and a second via 192.

The first active pattern F11 may be disposed on the first region I. The second active pattern F12 may be disposed on the second region II. Each of the first active pattern F11 and the second active pattern F12 may protrude upwardly in the vertical direction DR3 from the substrate 100. The first active pattern F11 may extend in the first horizontal direction DR1. The second active pattern F12 may be spaced apart from the first active pattern F11 in the second horizontal direction DR2. The second active pattern F12 may extend in the first horizontal direction DR1.

The field insulating layer 905 may be disposed on the substrate 100. The field insulating layer 105 may surround the side walls of each of the first active pattern F11 and the second active pattern F12. The field insulating layer 905 may include a protrusion 905*p* that protrudes upwardly in the vertical direction DR3 on the boundary line BL between the first region I and the second region II.

The first plurality of nanosheets NW1 may be disposed on the first active pattern F11. The first plurality of nanosheets NW1 may include a plurality of nanosheets stacked to be spaced apart from each other in the vertical direction DR3. The second plurality of nanosheets NW2 may be disposed on the second active pattern F12. The second plurality of nanosheets NW2 may include a plurality of nanosheets stacked to be spaced apart from each other in the vertical direction DR3.

Although FIGS. 25 and 26 show that each of the first and second plurality of nanosheets NW1 and NW2 includes three nanosheets stacked to be spaced apart from each other in the vertical direction DR3, this is for convenience of explanation, and the present disclosure is not limited thereto. In some other example embodiments, the first and second plurality of nanosheets NW1 and NW2 may each include four or more nanosheets stacked to be spaced apart from each other in the vertical direction DR3.

Each of the first gate electrode G11 and the second gate electrode G12 may extend in the second horizontal direction DR2 on the field insulating layer 905, the first active pattern F11, and the second active pattern F12. Each of the first gate electrode G11 and the second gate electrode G12 may intersect each of the first and second active patterns F11 and F12. The second gate electrode G12 may be spaced apart from the first gate electrode G11 in the first horizontal direction DR1.

The first gate electrode G11 may surround each of the first plurality of nanosheets NW1 and the second plurality of nanosheets NW2. The second gate electrode G12 may surround each of the first plurality of nanosheets NW1 and the second plurality of nanosheets NW2.

The first plurality of nanosheets NW1 surrounded by the first gate electrode G11 may be spaced apart from the first plurality of nanosheets NW1 surrounded by the second gate electrode G12 in the first horizontal direction DR1. Further, the second plurality of nanosheets NW2 surrounded by the first gate electrode G11 may be spaced apart from the second plurality of nanosheets NW2 surrounded by the second gate electrode G12 in the first horizontal direction DR1.

The gate spacer 912 may extend in the second horizontal direction DR2 along the side walls of each of the first and second gate electrodes G11 and G12 on the uppermost nanosheets of each of the first and second plurality of nanosheets NW1 and NW2. Each of the first and second gate electrodes G11 and G12 may be disposed inside a gate trench defined by the gate spacer 912 on the uppermost nanosheets of each of the first and second plurality of nanosheets NW1 and NW2.

Further, the gate spacer 912 may extend in the second horizontal direction DR2 along the side walls of each of the first and second gate electrodes G11 and G12 on the field insulating layer 905. Each of the first and second gate electrodes G11 and G12 may be disposed inside the gate trench defined by the gate spacer 912 on the field insulating layer 905.

For example, the internal spacer 914 may be disposed on both sides of each of the first and second gate electrodes G11 and G12 between the first plurality of nanosheets NW1. Further, the internal spacer 914 may be disposed on both sides of each of the first and second gate electrodes G11 and G12 between the first active pattern F11 and the lowermost nanosheet of the first plurality of nanosheets NW1. In some other example embodiments, the internal spacer 914 may be omitted.

The internal spacer 914 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), or combinations thereof. However, the present disclosure is not limited thereto.

The gate insulating layer 911 may be disposed between each of the first and second gate electrodes G11 and G12 and each of the first and second plurality of nanosheets NW1 and NW2. The gate insulating layer 911 may be disposed between each of the first and second gate electrodes G11 and G12 and the gate spacer 912. The gate insulating layer 911 may be disposed between each of the first and second gate electrodes G11 and G12 and the internal spacer 914. The gate insulating layer 911 may be disposed between each of the first and second gate electrodes G11 and G12 and each of the first and second active patterns F11 and F12. The gate insulating layer 911 may be disposed between each of the first and second gate electrodes G11 and G12 and the field insulating layer 905. The capping pattern 913 may be disposed on each of the first and second gate electrodes G11 and G12.

The first source/drain region 921 may be disposed on at least one side of each of the first and second gate electrodes G11 and G12 on the first active pattern F11. The first source/drain region 921 may be in contact with the first plurality of nanosheets NW1. The second source/drain region 922 may be disposed on at least one side of each of the first and second gate electrodes G11 and G12 on the second active pattern F12. The second source/drain region 922 may be in contact with a plurality of second nanosheets NW2.

The first etching stop layer 930 may be disposed along the profile of the upper surface of the field insulating layer 905. The first etching stop layer 930 may be disposed along the profiles of the side walls of each of the first source/drain region 921 and the second source/drain region 922.

The first source/drain contact 960 may extend in the second horizontal direction DR2 on the first active pattern F11, the field insulating layer 905 and the second active pattern F12. For example, the first source/drain contact 960 may be disposed between the first gate electrode G11 and the second gate electrode G12.

The first source/drain contact 960 may include a first portion 960_1, a second portion 960_2, and a third portion 960_3. The first portion 960_1 of the first source/drain contact 960 may be disposed between the first source/drain region 921 and the second source/drain region 922. The first portion 960_1 of the first source/drain contact 960 may be disposed on the protrusion 905p. A lower surface of the first portion 960_1 of the first source/drain contact 960 may include a recess 965 that is recessed upwardly in the vertical direction DR3. At least a part of the protrusion 905p may be disposed inside the recess 965. The first etching stop layer 930 is not disposed inside the recess 965. The first portion 960_1 of the first source/drain contact 960 may be in contact with the protrusion 905p inside the recess 965.

The second portion 960_2 of the first source/drain contact 960 may be disposed on the first portion 960_1 of the first source/drain contact 960. The third portion 960_3 of the first source/drain contact 960 may protrude upwardly in the vertical direction DR3 from the second portion 960_2 of the first source/drain contact 960. A width of the third portion 960_3 of the first source/drain contact 960 in the second horizontal direction DR2 may be narrower than a width of the second portion 960_2 of the first source/drain contact 960 in the second horizontal direction DR2.

The first source/drain contact 960 may include a barrier layer 961 and a filling layer 962. The barrier layer 961 may form side walls and bottom surfaces of the first portion 960_1 and the second portion 960_2 of the first source/drain contact 960. The filling layer 962 may be disposed on the barrier layer 961.

The silicide layer 925 may be disposed between the first source/drain region 921 and the first source/drain contact 960. Further, the silicide layer 125 may be disposed between the second source/drain region 922 and the first source/drain contact 960.

In concluding the detailed description, those skilled in the art will appreciate that many variations and modifications may be made to the disclosed example embodiments without substantially departing from the principles of the present disclosure. Therefore, the disclosed example embodiments of the disclosure are used in a generic and descriptive sense only and not for purposes of limitation.

What is claimed is:

1. A semiconductor device comprising:
    a substrate;
    a first active pattern extending in a first horizontal direction on the substrate;
    a second active pattern extending in the first horizontal direction on the substrate, the second active pattern being spaced apart from the first active pattern in a second horizontal direction, the second horizontal direction being different from the first horizontal direction;
a field insulating layer surrounding at least a part of side walls of each of the first and second active patterns on the substrate, the field insulating layer including a protrusion protruding upwardly in a vertical direction between the first active pattern and second active pattern;
a first source/drain region on the first active pattern;
a second source/drain region on the second active pattern; and
a source/drain contact electrically connecting the first source/drain region and the second source/drain region with each other, the source/drain contact including a first portion and a second portion, the first portion extending toward the field insulating layer between the first source/drain region and the second source/drain region, the second portion on the first portion,
wherein a lower surface of the first portion of the source/drain contact includes a recess which is recessed upwardly in the vertical direction,
wherein at least a part of the protrusion is inside the recess,
wherein the field insulating layer includes,
a first upper surface between the first active pattern and the protrusion, and
a second upper surface between the second active pattern and the protrusion, and
wherein the second upper surface of the field insulating layer is higher than the first upper surface of the field insulating layer.

2. The semiconductor device of claim 1, wherein an upper end of the protrusion is lower than an upper surface of the first active pattern that is in contact with the first source/drain region.

3. The semiconductor device of claim 1, wherein the first portion of the source/drain contact is in contact with the protrusion.

4. The semiconductor device of claim 1, wherein the source/drain contact further includes a third portion that protrudes upwardly in the vertical direction from the second portion of the source/drain contact, and
wherein a width of the third portion of the source/drain contact in the second horizontal is narrower than a width of the second portion of the source/drain contact in the second horizontal direction.

5. The semiconductor device of claim 4, wherein the third portion overlaps the protrusion in the vertical direction.

6. The semiconductor device of claim 1, wherein the lower surface of the first portion of the source/drain contact is lower than an upper surface of the first active pattern that is in contact with the first source/drain region.

7. The semiconductor device of claim 1, further comprising:
an interlayer insulating layer surrounding the first source/drain region and the source/drain contact on the field insulating layer; and
an etching stop layer being between the field insulating layer and the interlayer insulating layer, and being between the first source/drain region and the interlayer insulating layer.

8. The semiconductor device of claim 7, wherein at least a part of the interlayer insulating layer is between the lower surface of the first portion of the source/drain contact and each of the first and second upper surfaces of the field insulating layer.

9. The semiconductor device of claim 7, wherein at least a part of the etching stop layer is between the protrusion and the interlayer insulating layer.

10. The semiconductor device of claim 1, wherein the first portion of the source/drain contact includes a first lower surface facing the first upper surface of the field insulating layer, and a second lower surface facing the second upper surface of the field insulating layer, and
wherein the second lower surface of the first portion of the source/drain contact is on a same plane as the first lower surface of the first portion of the source/drain contact.

11. The semiconductor device of claim 1, wherein the lower surface of the first portion of the source/drain contact is in contact with each of the first and second upper surfaces of the field insulating layer.

12. The semiconductor device of claim 1, wherein the first portion of the source/drain contact includes a first lower surface facing the first upper surface of the field insulating layer, and a second lower surface facing the second upper surface of the field insulating layer, and
wherein the second lower surface of the first portion of the source/drain contact is higher than the first lower surface of the first portion of the source/drain contact.

13. The semiconductor device of claim 1, wherein the substrate includes an NMOS region and a PMOS region, and
wherein the first active pattern is formed on the NMOS region, the second active pattern is formed on the PMOS region.

14. The semiconductor device of claim 13, wherein the protrusion is on a boundary line between the NMOS region and the PMOS region.

15. A semiconductor device comprising:
a substrate;
a first active pattern extending in a first horizontal direction on the substrate;
a second active pattern extending in the first horizontal direction on the substrate, the second active pattern being spaced apart from the first active pattern in a second direction, the second horizontal direction being different from the first horizontal direction;
a first plurality of nanosheets stacked to be spaced apart from each other in a vertical direction on the first active pattern;
a second plurality of nanosheets stacked to be spaced apart from each other in the vertical direction on the second active pattern;
a gate electrode extending in the second horizontal direction on the first and second active patterns, the gate electrode surrounding each of the first plurality of nanosheets and each of the second plurality of nanosheets;
a field insulating layer surrounding at least a part of side walls of each of the first and second active patterns on the substrate, the field insulating layer including a protrusion protruding upwardly in the vertical direction between the first active pattern and second active pattern;
a first source/drain region on at least one side of the gate electrode on the first active pattern;
a second source/drain region on at least one side of the gate electrode on the second active pattern; and
a source/drain contact electrically connecting the first source/drain region and the second source/drain region with each other, the source/drain contact including a first portion and a second portion, the first portion extending toward the field insulating layer between the first source/drain region and the second source/drain region, the second portion on the first portion, wherein the first portion of the source/drain contact is in contact with the protrusion.

16. The semiconductor device of claim 15, wherein a lower surface of the first portion of the source/drain contact includes a recess which is recessed upwardly in the vertical direction, and wherein at least a part of the protrusion is inside the recess.

17. The semiconductor device of claim 15, wherein the source/drain contact further includes a third portion that protrudes upwardly in the vertical direction from the second portion of the source/drain contact, and wherein a width of the third portion of the source/drain contact in the second horizontal is narrower than a width of the second portion of the source/drain contact in the second horizontal direction.

18. The semiconductor device of claim 15, further comprising:

an interlayer insulating layer surrounding the first source/drain region and the source/drain contact on the field insulating layer; and an etching stop layer being between the field insulating layer and the interlayer insulating layer, and being between the first source/drain region and the interlayer insulating layer.

19. The semiconductor device of claim 18, wherein at least a part of the interlayer insulating layer is between a lower surface of the first portion of the source/drain contact and an upper surface of the field insulating layer.

20. The semiconductor device of claim 15, wherein the substrate includes an NMOS region and a PMOS region, and wherein the first active pattern is formed on the NMOS region, the second active pattern is formed on the PMOS region.

* * * * *